United States Patent [19]
Akiba et al.

[11] Patent Number: 6,040,201
[45] Date of Patent: *Mar. 21, 2000

[54] METHOD OF MANUFACTURING THIN FILM DIODE

[75] Inventors: Yuichi Akiba; Masafumi Ide, both of Tokorozawa, Japan

[73] Assignee: Citizen Watch Co., Ltd., Tokyo, Japan

[*] Notice: This patent is subject to a terminal disclaimer.

[21] Appl. No.: 08/931,972

[22] Filed: Sep. 15, 1997

[30] Foreign Application Priority Data

Sep. 17, 1996 [JP] Japan ................................... 8-244767

[51] Int. Cl.[7] .................................................. H01L 21/00
[52] U.S. Cl. ............................ 438/30; 430/312; 430/321
[58] Field of Search ..................... 438/328, 30; 430/321, 430/312, 34

[56] References Cited

U.S. PATENT DOCUMENTS

| | | |
|---|---|---|
| 4,653,858 | 3/1987 | Szydlo et al. . |
| 5,086,009 | 2/1992 | Sangouard . |
| 5,313,322 | 5/1994 | Takanashi et al. . |
| 5,866,301 | 2/1999 | Ide et al. . |

OTHER PUBLICATIONS

IEEE Transactions on Electron Devices, vol. ED28, No. 6, pp. 736–739, Jun. 1981.
Jpn. J. Appl. Phys. vol. 31, Part 1, No. 12B pp. 4582–4585, Dec. 1992.

*Primary Examiner*—Chandra Chaudhari
*Assistant Examiner*—Scott J. Hawranek
*Attorney, Agent, or Firm*—Armstrong, Westerman, Hattori, McLeland & Naughton

[57] ABSTRACT

A method of manufacturing a thin film diode incorporated in a liquid crystal display, comprising a lower electrode connected with a signal electrode, an anodic oxidation film formed on the surface of the lower electrode, and an upper electrode formed so as to overlie the lower electrode via the anodic oxidation film and connected with a pixel electrode. The thin film diode is fabricated by forming a lower electrode material film made of a tantalum nitride film on a substrate, forming the lower electrode and the signal electrode by means of etching the lower electrode material film, forming the anodic oxidation film made of a tantalum oxide film on the surface of the lower electrode by means of the anodic oxidation treatment applied thereto, forming an upper electrode material film composed of a transparent and electrically conductive film on the entire surface of the substrate after an annealing applied in a vacuum, and forming the upper electrode and the pixel electrode by means of etching the upper electrode material film using a photoresist as an etching mask, after applying another annealing in a vacuum.

14 Claims, 17 Drawing Sheets

METHOD OF MANUFACTURING THIN FILM DIODE

BACKGROUND OF THE INVENTION

1. Field of the Invention

The present invention relates to a method of manufacturing thin film diodes provided in a liquid crystal display, and more particularly to a method of fabricating thin film diodes which are nonlinear resistance elements serving as switching elements against a multitude of pixels arranged in a matrix form on a display face of the liquid crystal display.

2. Description of the Related Art

Along with an advance in commercial application of liquid crystal displays, liquid crystal displays (hereinafter referred to as "LCD") of an active matrix type, capable of displaying high quality images, are about to occupy a dominant position in the market.

The active matrix LCD described above is provided with nonlinear resistance elements comprising thin film transistors (TFTs) or thin film diodes (TFDs) of a (metal-insulator-metal) laminated structure, composed of metal-anodic oxidation film-metal layers or metal-anodic oxidation film-transparent and electrically conductive film layers, as switching elements against respective pixel electrodes arranged in a matrix form on the display face of the LCD.

With the LCD provided with the thin film diodes serving as switching elements, images are written by switching the thin film diodes on and off so as to apply voltages to the respective pixel electrodes connected in series to the thin film diodes, taking advantage of a nonlinear current-voltage characteristic of the thin film diodes.

An example of the construction of a liquid crystal display provided with such thin film diodes as described above is shown in FIG. 34.

FIG. 34 is a perspective view of the LCD of the active matrix type for display in color showing schematically the construction thereof.

The LCD comprises a first substrate 1 and a second substrate 2 which are both made of glass and disposed in parallel so as to face each other, forming a gap therebetween, and liquid crystals 3 are filled in the gap. A multitude of pixel electrodes 4 composed of transparent and electrically conductive films are formed in a matrix configuration on the upper surface of the first substrate 1, and are connected via respective thin film diodes 5 with signal electrodes 6 extended along rows.

On the other hand, color filters 7 for R (red), G (green), and B (blue), respectively, and facing electrodes 8 disposed opposite to the pixel electrodes 4 and extended along columns perpendicular to the signal electrodes 6 are provided on the underside surface of the second substrate 2.

Further, polarizers 9 and 10 are disposed on the external surfaces of the first substrate 1 and the second substrate 2, respectively, and white light is irradiated from under the first substrate 1 as shown by the arrows in the figure.

Then, voltages are applied between the respective pixel electrodes 4 and the respective facing electrodes 8 selectively via the respective signal electrodes 6 and the respective thin film diodes 5, thereby creating electric fields, by which data are written into the liquid crystals 3 sandwiched between both electrodes as described in the foregoing so that images are displayed by controlling the transmission of irradiated light.

An LCD for displaying images in monochromatic mode can be manufactured by dispensing with the color filters 7.

The constitution of the thin film diode 5 used in the LCD is described hereafter with reference to FIGS. 35 and 36. FIG. 35 is a plan view showing the pixel electrode 4 constituting one pixel, the thin film diode 5, and the signal electrode 6, which are disposed on the first substrate 1 as shown in FIG. 34, and FIG. 36 is an enlarged sectional view taken along line C—C in FIG. 35.

The thin film diode 5 comprises a lower electrode 13 connected with the signal electrode 6, an anodic oxidation film 15 formed on the surface of the lower electrode 13 as shown in FIG. 36, and an upper electrode 17 formed in such a way as to overlie the lower electrode 13 via the anodic oxidation film 15 and connected with the pixel electrode 4.

A conventional method of fabricating such a thin film diode as described above has been disclosed in, for example, "IEE TRANSACTIONS ON ELECTRON DEVICES, VOL. ED-28 NO. 6 JUNE 1981 736–739". The aforesaid method is briefly described with reference to FIGS. 35 and 36.

A lower electrode material made of tantalum nitride (TaNx) is first applied to the entire surface of a substrate 1 made of glass in an atmosphere of a mixture of an argon gas and a nitrogen gas by use of the reactive sputtering method.

Thereafter, a photoresist is formed on the entire surface of the lower electrode material film by use of a spin coater, and patterning on a photoresist (not shown) is provided in the form of the lower electrode 13 by means of exposure and development treatments applied to the photoresist using a predetermined photo mask. Formation of the photoresist on the entire surface combined with the exposure and development treatments using the photo mask is hereafter referred to as a photolithographic treatment.

Then, the lower electrode 13 is formed by etching the lower electrode material film, that is, the tantalum nitride, using the patterned photoresist as an etching mask. As shown in FIG. 35, the lower electrode 13 is formed in a plane pattern in such a way as to protrude from the signal electrode 6 perpendicularly.

Thereafter, by applying an anodic oxidation treatment to the lower electrode 13, an anodic oxidation film 15 composed of a tantalum oxide ($Ta_2O_5$) film is formed on the surface of the lower electrode 13 as shown in FIG. 36. The anodic oxidation treatment is carried out by applying a voltage at 36 V using, for example, an aqueous solution containing 0.1 wt % of citric acid as anodic oxidation solution.

Subsequently, by applying the vacuum evaporation method, an upper electrode material film made of nickel-chrome gold composed of a transparent and electrically conductive film is formed.

Thereafter, patterning is made on a photoresist film (not shown) by applying the photolithographic treatment thereto, and then using the patterned photoresist film as an etching mask, the upper electrode material film is etched, thus forming the upper electrode 17.

As shown in FIG. 35, the upper electrode 17 is formed in a plane pattern such that an opening is defined in a part of the region for the pixel electrode 4, and the upper electrode 17 overlies the lower electrode 13.

The method of fabricating the thin film diode, described in the foregoing has an advantage in that the number of processing steps is reduced and, particularly, patterning on the photoresist film needs to be done only twice. By using the tantalum nitride film as the material of the lower electrode 13, nonlinear current-voltage characteristics of the thin film diodes can be increased, thereby improving switching characteristics.

However, LCDs provided with the thin film diodes fabricated by this method pose a problem of an after-image phenomenon occurring every time when the whole display is switched in the course of driving the LCDs.

Referring to the diagram shown in FIG. 37, the after-image phenomenon is described in detail hereafter. It is to be pointed out that the LCD in this case is of normally white display mode and provided with two polarizers 9 and 10 as shown in FIG. 34 which are disposed such that light is allowed to be transmitted when no voltage is applied. In FIG. 37, the ordinate and abscissa of the diagram indicate relative transmissivity (%) and time (minutes), respectively.

The figure shows variation in relative transmissivity of light when a voltage applied to a pixel at random is varied at an interval of 5 minutes. More specifically, a voltage for display at 50% of transmissivity is applied first for 5 minutes (half-tone displaying period: T1), then a different voltage for display at 10% of transmissivity is applied for the next 5 minutes (black displaying period: T2), and further the same voltage as applied for the first half-tone displaying period, that is, T1, is applied for yet another 5 minutes (half-tone displaying period: T3).

The after-image phenomenon is a phenomenon wherein a difference (ΔT) in transmissivity between the first half-tone displaying period T1 and the next half-tone displaying period T3 occurs at the outset of the period T3 although voltages applied for respective periods remain the same. With an LCD using the thin film diodes fabricated by the conventional method described above, the difference (ΔT) in transmissivity was found to be about 5%.

The occurrence of the after-image phenomenon described above results in the display of images with their contents different from those of the originally intended images.

It means that the after-image phenomenon, also called the image-sticking phenomenon, causes the quality of images displayed by the LCD to be degraded considerably, posing a serious problem in commercial applications of the LCD.

SUMMARY OF THE INVENTION

It is an object of the present invention to restrain the after-image phenomenon described above from occurring so that the quality of images displayed by the LCD employing thin film diode elements with excellent switching characteristics is improved, and further to provide a method of manufacturing a thin film diode capable of achieving the aforesaid object.

Therefore, the method of manufacturing the thin film diode according to the invention is to manufacture the thin film diode incorporated in the liquid crystal display, comprising a lower electrode connected with a signal electrode, an anodic oxidation film formed on the surface of the lower electrode, and an upper electrode formed so as to overlie the lower electrode via the anodic oxidation film and connected with a pixel electrode, as described in the foregoing. The method comprises the following processes from (A) to (H):

(A) a process comprising the steps of forming a lower electrode material film made of a tantalum nitride film on a substrate, forming a photoresist on the lower electrode material film, and patterning on the photoresist by applying the photolithographic treatment, (B) a process of forming the lower electrode and the signal electrode by etching the lower electrode material film using the patterned photoresist as an etching mask, (C) a process of forming an anodic oxidation film made of a tantalum oxide film on the surface of the lower electrode by applying the anodic oxidation treatment to the lower electrode using an anodic oxidation solution, (D) a first annealing process applied annealing in a vacuum to the anodic oxidation film, (E) a process of forming an upper electrode material film composed of a transparent and electrically conductive film on the entire surface of the substrate including the surface of the lower electrode with the anodic oxidation film formed thereon, (F) a second annealing process applied annealing in a vacuum to the substrate with the upper electrode material film formed thereon, (G) a process comprising the steps of forming a photoresist on the upper electrode material film, and patterning on the photoresist by applying the photolithographic treatment, and (H) a process of forming the upper electrode and the pixel electrode by etching the upper electrode material film using the patterned photoresist as an etching mask.

The second annealing process described under (F) above may be substituted by a second annealing process (I) applied annealing in a vacuum to the substrate with the upper electrode and the pixel electrode formed thereon by the process under (H) above.

In the above process (A), the lower electrode material made of a tantalum nitride film may be formed on the substrate by the reactive sputtering method using the nitrogen gas as a reaction gas and targeting the tantalum.

After completion of the process described under (H) or (I) above, a process of forming an overcoating film made of an insulation material on the entire surface of the substrate may preferably be added.

In addition, the first annealing process under (D) above is desired to be carried out at a temperature of 400° C. to 500° C. for 120 minutes or longer.

The present invention is also applicable similarly to a method of fabricating a pair of thin film diodes (connected to each other, back to back) incorporated in a liquid crystal display, comprising a lower electrode in the shape of an island extended from a signal electrode, an anodic oxidation film formed on the surface of the lower electrode, and a first upper electrode and a second upper electrode which are formed so as to overlie the lower electrode via the anodic oxidation film, the second upper electrode being connected to a pixel electrode.

In that case also, after forming an anodic oxidation film made of tantalum oxide on the surface of the lower electrode made of a tantalum nitride film formed on the substrate, the annealing is applied in a vacuum, and after the upper electrode material made of a transparent and electrically conductive film is formed over the entire surface of the substrate, or the upper electrode and the pixel electrode are formed by patterning by etching the upper electrode material, the annealing is applied in a vacuum again.

As a result of adopting the processing steps of applying an annealing process in a vacuum twice as described above, liquid crystal displays incorporating the thin film diode fabricated by the method of manufacturing according to the invention are able to display images of high quality by restraining occurrence of the after-image phenomenon.

The above and other objects, features, and advantages of the invention will be apparent from the following detailed description which is to be read in conjunction with the accompanying drawings.

DETAILED DESCRIPTION OF THE PREFERRED EMBODIMENTS

With reference to the accompanying drawings, embodiments of the present invention are described in detail hereafter.

[First Embodiment: FIG. 1 to FIG. 17]

Figure 7:
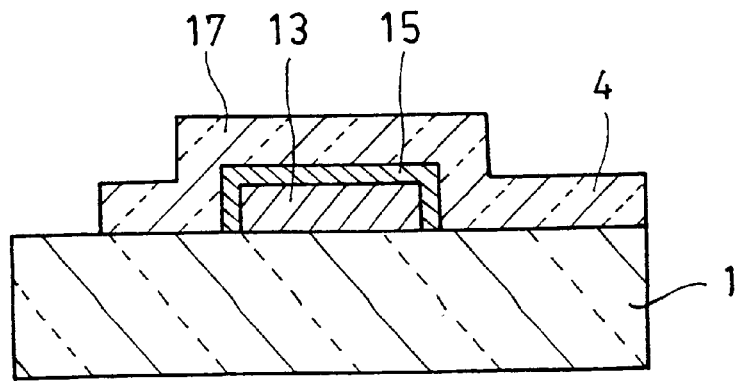
Figure 8:
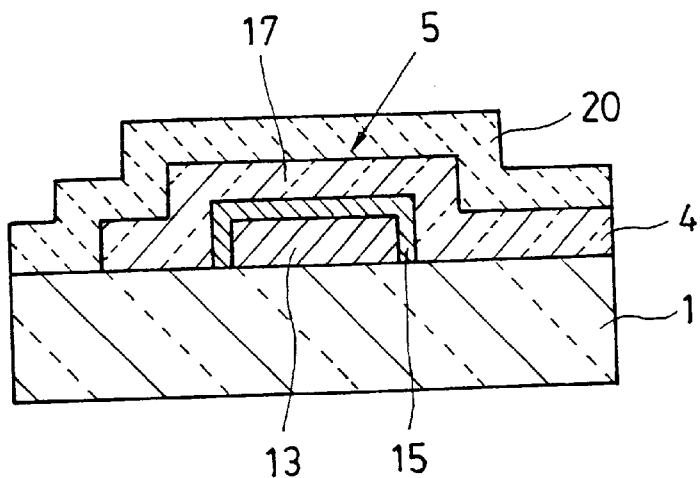
Figure 9:
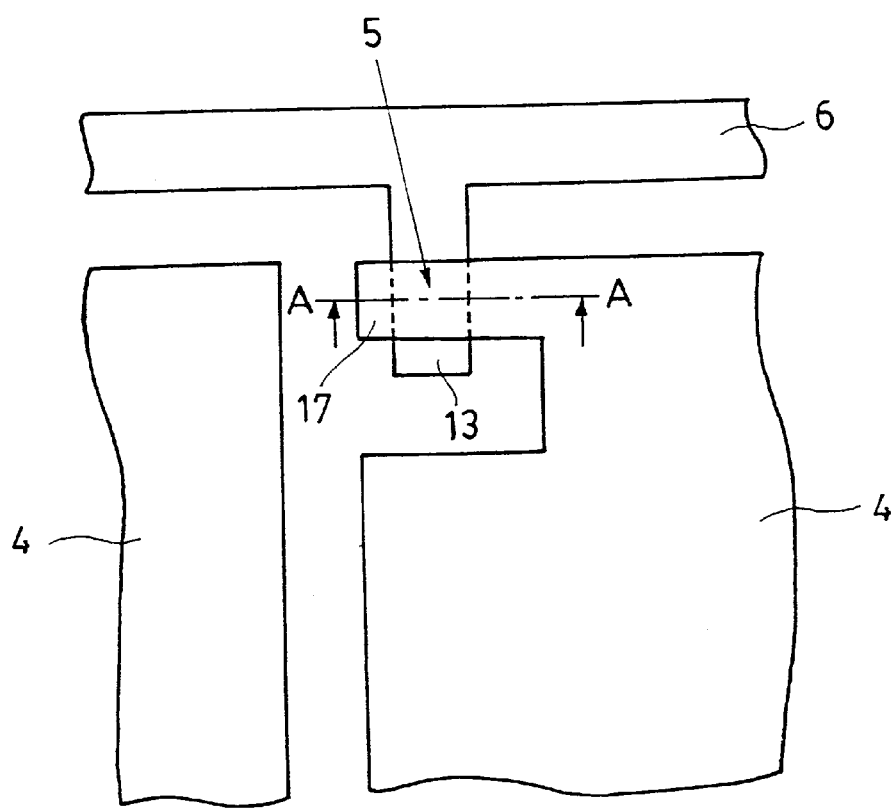
FIG. 9 is a partial plan view of a liquid crystal display provided with the thin film diode fabricated by the method according to the first embodiment of the invention.
Figure 35:
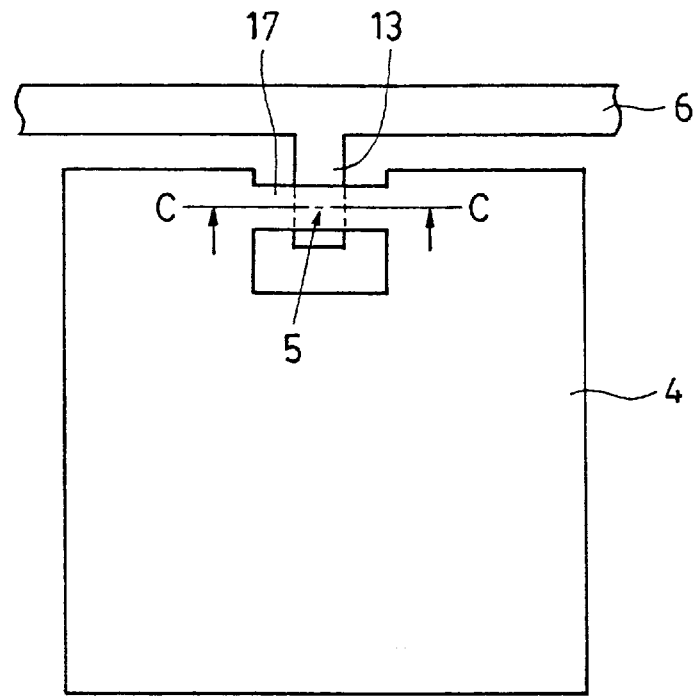
FIG. 35 is a plan view showing a pixel electrode and a thin film diode for one pixel in FIG. 34.
Figure 36:
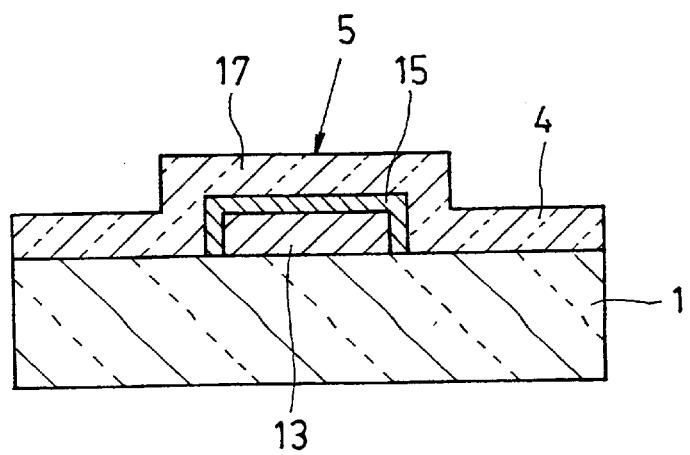
FIG. 36 is an enlarged sectional view taken along the line C—C in FIG. 35.

FIGS. 1 to 9 illustrate a first embodiment of a method of fabricating a thin film diode according to the invention. FIG. 9 is a partial plan view of a liquid crystal display (LCD) provided with the thin film diode, and FIGS. 1 to 8 are enlarged sectional views taken along the line A—A in FIG. 9, illustrating respective steps of the method of fabricating the thin film diode. In these figures, parts corresponding to those previously described with reference to FIGS. 34 to 36 are denoted by the same reference numerals.

Referring to FIGS. 8 and 9, the construction of the thin film diode incorporated in the LCD, fabricated by the method according to the first embodiment, is described.

Figure 34:
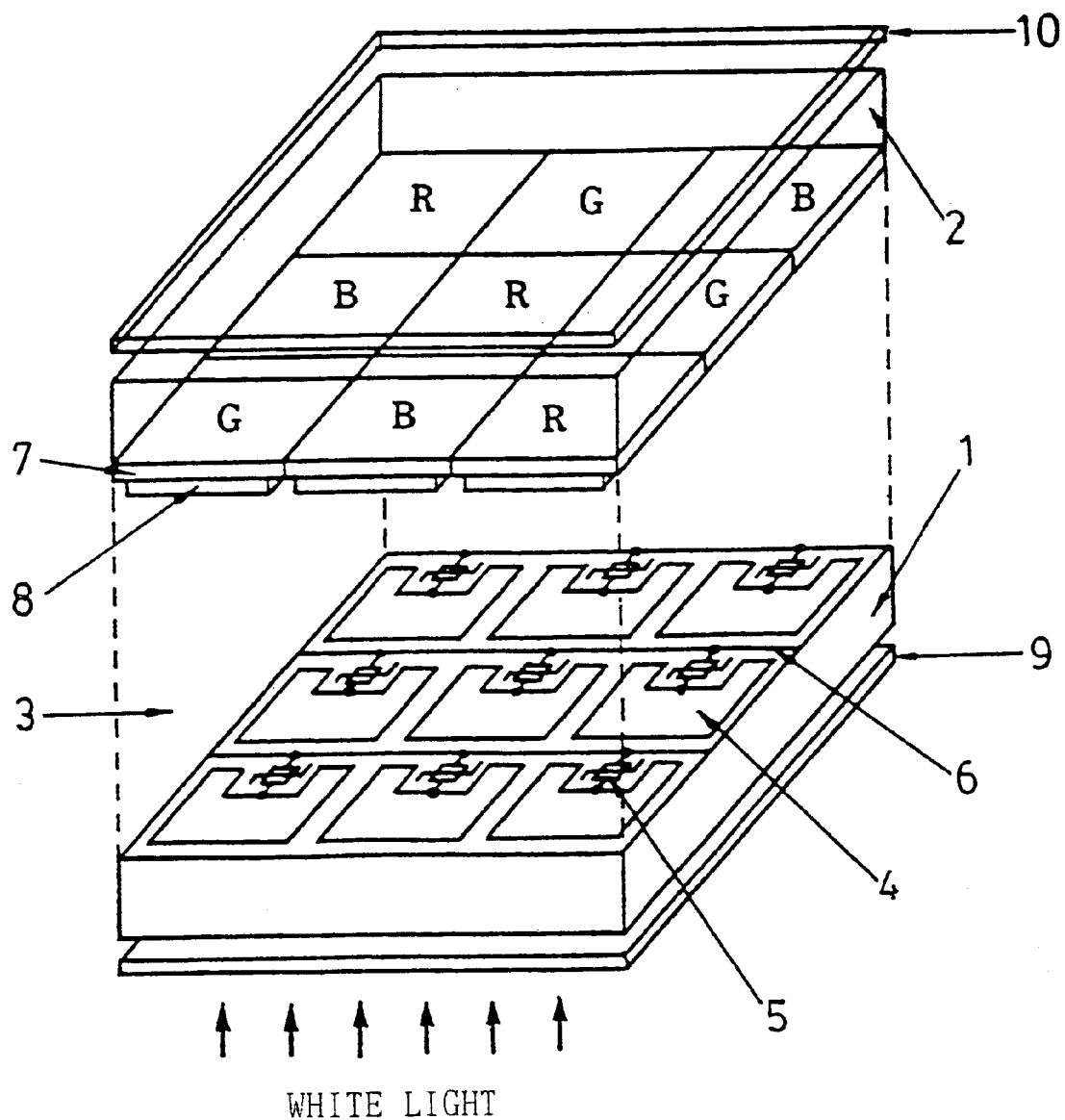
FIG. 34 is a schematic perspective view illustrating an example of an LCD provided with a thin film diode as a switching element.

The thin film diode (TFD) 5 is formed on a substrate 1 (corresponding to the first substrate 1 in FIG. 34). The thin film diode 5 comprises a lower electrode 13 joined with a signal electrode 6, an anodic oxidation film 15 formed on the surface of the lower electrode 13, and an upper electrode 17 formed in such a way as to overlie the lower electrode 13 via the anodic oxidation film 15. The upper electrode 17 is joined with a pixel electrode 4.

In addition, an overcoating film 20 is formed on the entire surface of the substrate 1. However, the overcoating film 20 may be omitted.

Referring to FIGS. 1 to 8, the respective steps of the method of fabricating the thin film diode 5 according to the first embodiment of the invention are described hereafter.

Figure 1:
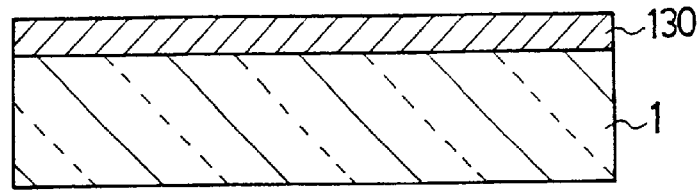
FIGS. 1 to 8 are sectional views showing respective steps of the method of fabricating a thin film diode according to a first embodiment of the invention, corresponding to enlarged sectional views taken along the line A—A in FIG. 9.

As shown in FIG. 1, a tantalum nitride film serving as a lower electrode material film 130 is first formed to a thickness of 100 nm on the entire surface of the substrate 1 made of an insulating glass. The lower electrode material 130 is formed by means of the reactive sputtering process targeting a tantalum (Ta) target and controlling the sputtering pressure to 6 mTorr in an atmosphere of a mixture gas of 95% argon and 5% nitrogen as a reaction gas.

Figure 2:
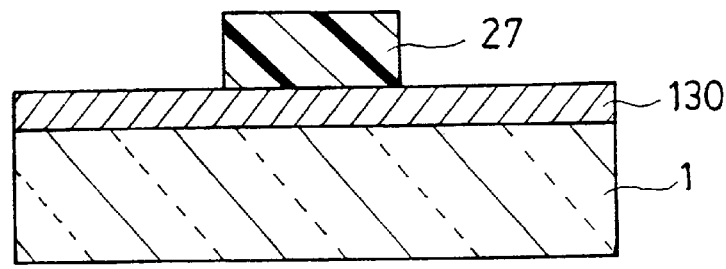

Thereafter, a positive type photoresist is formed on the entire surface of the lower electrode material film 130 by use of a spin coater, and as shown in FIG. 2, and a photoresist 27 patterned in the shape of the lower electrode 13 and the signal electrode 6 is formed by means of a photolithographic processing comprising exposure and development treatments using a photo mask.

Then, the substrate 1 is introduced into an etching chamber of an etching tool provided with parallel plate electrodes, and as etching gases, sulfur hexafluoride ($SF_6$), helium (He), and oxygen ($O_2$) are fed into the etching chamber at a flow rate of 100 cc/min, 100 cc/min, and 50 cc/min, respectively, keeping the pressure inside the etching chamber at 80 mTorr and supplying 300 kW of RF power.

Figure 3:
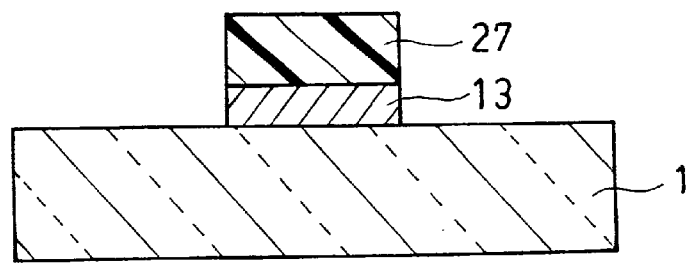

Subsequently, the tantalum nitride film, that is, the lower electrode material film 130 is etched using the photoresist 27 as an etching mask, thereby forming the lower electrode 13 of the thin film diode as shown in FIG. 3 and the signal electrode 6 (FIG. 9).

After the etching treatment, the lower electrode 13 and the signal electrode 6 are formed in a plane pattern such that the lower electrode 13 protrudes from the signal electrode 6 at a right angle thereto, as shown in the plan view of FIG. 9.

Figure 4:
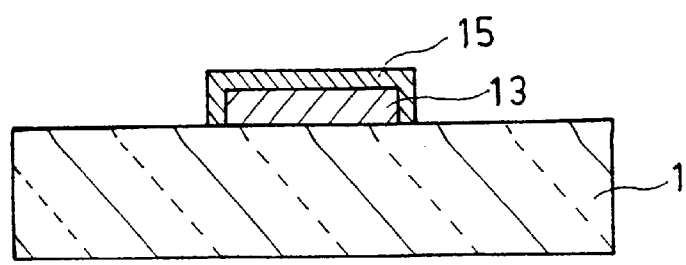

Then, as shown in FIG. 4, an anodic oxidation film 15 is formed on the surface of the lower electrode 13.

An anodic oxidation treatment for forming the anodic oxidation film 15 is applied using an aqueous solution of ammonium borate as the anodic oxidation solution. Specifically, the substrate 1 is immersed in an oxidation cell filled up with the anodic oxidation solution, and a DC voltage from a DC power source is applied between a platinum cathode and the lower electrode 13 serving as anode via the signal electrode 6.

Hereupon, an anodic oxidation voltage (the DC voltage described above) is set at 24 V-such that the anodic oxidation film 15 is formed to a thickness of 50 nm by increasing the voltage at a rate of 0.2 V/min and maintaining a hold voltage for one hour. In the plan view of FIG. 9, the anodic oxidation film 15 is not shown.

Thereafter a first annealing process in a vacuum is applied to the substrate 1 with the anodic oxidation film 15 formed thereon. The first annealing process is carried out under conditions of a degree of vacuum at $1 \times 10^{-5}$ Torr or less, a temperature of 400° C. to 500° C. and an annealing time for 120 min (two hours) or longer (preferably, for about three to six hours).

Figure 5:
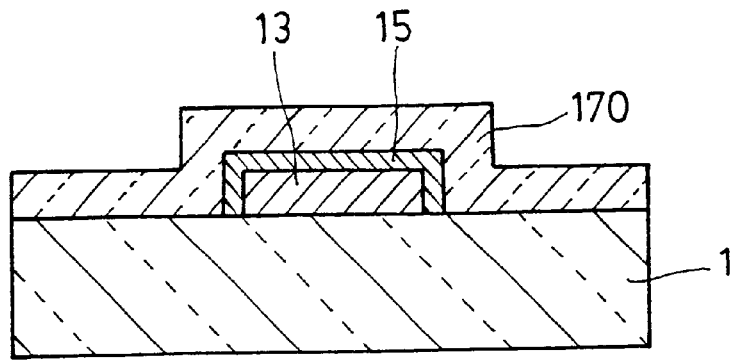

Then, as shown in FIG. 5, a transparent and electrically conductive film made of indium tin oxide (ITO) as an upper electrode material film 170 is formed on the entire surface of the substrate 1. The upper electrode material 170 is formed to a thickness of 100 nm by means of the sputtering process wherein an argon gas containing 0.5 to 1% of oxygen is fed into a sputtering chamber and a sputtering pressure is controlled to 10 mTorr.

Subsequently, a second annealing process in a vacuum is applied to the substrate 1 with the upper electrode material film 170 formed thereon. The second annealing process is carried out under conditions of a degree of vacuum at $1 \times 10^{-5}$ Torr or less, a temperature of 400° C., and a processing time for 120 min (two hours).

Figure 6:
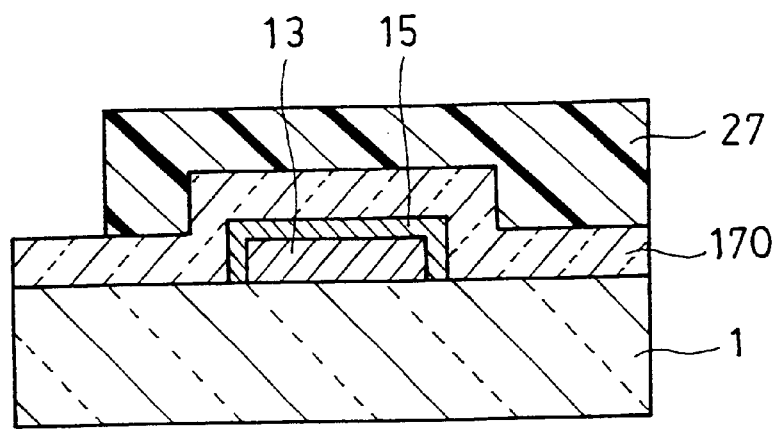

Then a photoresist is again formed on the entire surface of the upper electrode material film 170 by use of the spin coater and as shown in FIG. 6, a photoresist 27 patterned in the shape of the upper electrode 17 and the pixel electrode 4 (refer to FIG. 9) is formed by means of the photolithographic processing comprising exposure and development treatments using a photo mask.

As shown in FIG. 7, the upper electrode 17 and the pixel electrode 4 are formed by patterning on the upper electrode material film 170 using the photoresist 27 as etching mask. The etching of the upper electrode material film 170 made of indium tin oxide is carried out in a wet etching system using a mixture of ferric chloride and hydrochloric acid.

Thereafter, the photoresist 27 used as an etching mask is removed in a wet-type resist stripping system using a mixed solution of sulfuric acid and hydrogen peroxide. FIG. 7 shows the condition of the substrate 1 after removal of the photoresist 27.

As shown in the plan view of FIG. 9, the upper electrode 17 and the pixel electrode 4 are formed in a plane pattern such that the upper electrode 17 overlies the lower electrode 13 by extending a part of the region for the pixel electrode 4 so as to cross the lower electrode 13 at a right angle thereto.

Further, thereafter, an overcoating film 20 made of tantalum oxide (TaOx) is formed covering the entire surface of the substrate 1 with the thin film diode 5 formed thereon as shown in FIG. 8. The overcoating film 20 is formed to a thickness of 100 nm by means of the sputtering process wherein an argon gas containing 3% oxygen is fed into the vacuum chamber at a pressure of 5 mTorr. It becomes possible to increase a voltage applied to a liquid crystal layer by forming the overcoating film with tantalum oxide such as tantalum pentoxide ($Ta_2O_5$), and the like, having a large permittivity.

The overcoating film 20 is provided to prevent short-circuiting from occurring between two substrates, that is, the signal electrode 6 and the pixel electrode 4 on the first substrate 1 on which the thin film diode 5 is formed, on one hand, and facing electrodes on the second substrate (corresponding to the second substrate 2 in FIG. 34) opposing the substrate 1 on the other hand.

By executing the respective steps of processing as described above, the respective thin film diodes 5 are formed between the signal electrode 6 and each of the pixel electrodes 4 both of which are formed on the first substrate 1.

In this embodiment, the lower electrode 13 forming the thin film diode 5 comprises the tantalum nitride film, with the anodic oxidation film 15 as a nonlinear resistance element, composed of the tantalum oxide film, and the upper electrode 17 composed of the transparent and electrically conductive film made of the indium tin oxide film.

However, the last step of forming the overcoating film 20 may be omitted.

Although as shown in FIG. 4, a case of using ammonium borate for the anodic oxidation solution is described by way of example when applying the anodic oxidation process to form the anodic oxidation film 15 on the surface of the lower electrode 13, phosphoric acid or ammonium phosphate may also be used for the anodic oxidation solution. Alternatively, citric acid used in the conventional method may also be used.

Further, in this embodiment, although the second annealing process is applied after the upper electrode material film 170 composed of the transparent and electrically conductive film is formed on the substrate 1 and before the upper electrode 17 and the pixel electrode 4 are formed by patterning, the second annealing process may be applied after the formation of the upper electrode 17 and the pixel electrode 4 by patterning.

Figure 10:
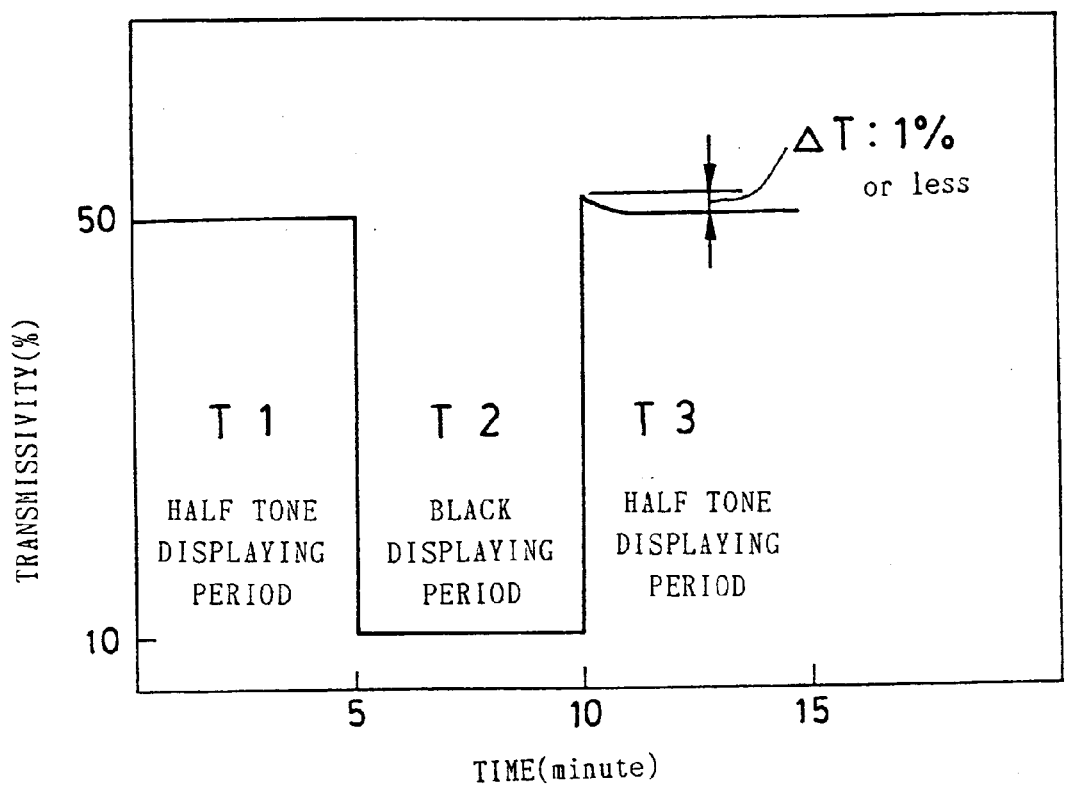
FIG. 10 is a diagram illustrating an after-image phenomenon occurring in an LCD provided with the thin film diode fabricated by the method according to the first embodiment of the invention.

An after-image phenomenon occurring in the LCD provided with the thin film diode fabricated by the method of fabricating a thin film diode according to the invention as described above is described hereafter with reference to FIG. 10.

Similar to the diagram shown in FIG. 34 for describing the after-image phenomenon in the case of a prior art, FIG. 10 shows variation in transmissivity of light when varying at an interval of 5 minutes a voltage applied to the LCD provided with the thin film diodes fabricated by the aforesaid method according to the invention. With this LCD, the display is made in a normally white mode. With reference to FIG. 10, the ordinate indicates relative transmissivity (%) and the abscissa indicates time (minutes).

In this case too, a voltage for displaying at 50% of transmissivity is applied for the first 5 minutes (half-tone displaying period: T1), then a different voltage for displaying at 10% of transmissivity is applied for next 5 minutes (black displaying period: T2), and further the same voltage as applied for the first half-tone displaying period, that is, T1, is applied for yet another 5 minutes (half-tone displaying period: T3).

Figure 37:
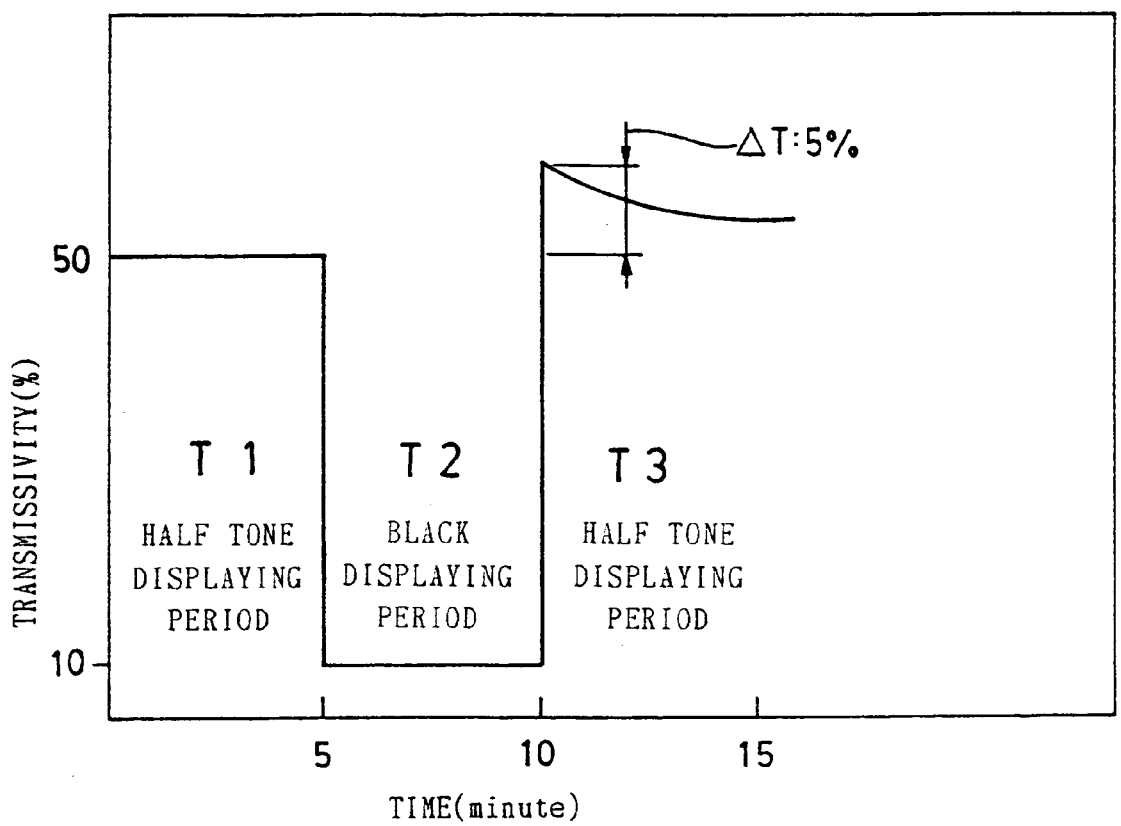
FIG. 37 is a diagram for describing the after-image phenomenon occurring in an LCD provided with a thin film diode fabricated by a conventional method.

As described in the foregoing with reference to FIG. 37, the after-image phenomenon is a phenomenon wherein a difference ($\Delta T$) in transmissivity develops between the first half-tone displaying period T1 and the next half-tone displaying period T3 at the outset of the period T3 although voltages applied for respective periods remain the same.

Experiments show that with the LCD using the thin film diodes fabricated by the method described above as switching elements, the difference ($\Delta T$) in transmissivity is reduced down to 1% or less as shown in FIG. 10. Further, the difference ($\Delta T$) in transmissivity reduces rapidly with the lapse of time to nearly zero within a short time period.

Further, a test for image display was carried out using a flat-panel LCD provided with the thin film diodes fabricated by the method of the invention described above as switching elements. The results indicate that the after-image phenomenon is nearly eliminated, demonstrating obvious differences in display image quality between flat-panel LCDs using thin film diodes fabricated by the conventional method and the one using the thin film diodes fabricated by the method of the invention.

It is deemed by the inventor that occurrence of the after-image phenomenon is restrained by a cause described hereafter.

The main cause for the after-image phenomenon occurring in an LCD provided with the thin film diodes fabricated by the conventional method is a shift in an element characteristic of the thin film diodes being driven. Further, it is deemed that there is a correlation between the occurrence of the characteristic shift of the thin film diode elements and the density of electrons caught by traps existing at deep levels in the anodic oxidation film and at surface levels on the interface between the upper electrode and the lower electrode. The traps causing the characteristic shift of the thin film diodes are created presumably by excess oxygen existing in the anodic oxidation film and on the interface between the upper electrode and the lower electrode. Accordingly, it is desirable to remove the excess oxygen.

Particularly, in the anodic oxidation treatment using tantalum nitride as the base material, nitrogen atoms contained in the tantalum nitride serving as the base material are captured in the anodic oxidation film simultaneously with the growth of the anodic oxidation film. In this case, it is considered that the nitrogen atoms captured in the anodic oxidation film bond to the tantalum atoms or oxygen atoms, i.e., the elements constituting the anodic oxidation film, or exist interstitially.

Accordingly, when the annealing process is applied to the anodic oxidation film of a base material of tantalum nitride at a temperature of 400° C. to 500° C. for 120 to 360 minutes as in the present invention, the diffusion distance of oxygen is increased with the increase of the diffusion rate of the oxygen contained in the anodic oxidation film. Therefore, after-image phenomena can be reduced since the diffusion amount of the oxygen to the lower electrode material from the anodic oxidation film is large even when the nitrogen atoms are captured in the anodic oxidation film which results in decrease of the traps causing the characteristic shift of the thin film diodes.

When the annealing is applied to the anodic oxidation film of a base material of tantalum nitride at a temperature of 400° C. or lower, or for time shorter than 120 minutes, the after-image phenomenon cannot be reduced since the nitrogen atoms existing in the anodic oxidation film prevent diffusion of oxygen from the anodic oxidation film to the lower electrode material, insufficiently eliminating the excess oxygen.

Also, it is considered that the concentration of excess oxygen in the lower electrode on its interface with the anodic oxidation film and in the vicinity of the anodic oxidation film is brought under control by applying the annealing in a vacuum to the anodic oxidation film while the concentration of excess oxygen in the anodic oxidation film on its interface with the upper electrode and in the vicinity of the upper electrode is brought under control by applying the annealing in a vacuum after the transparent and electrically conductive film serving as the upper electrode is formed.

More specifically, the annealing applied to the anodic oxidation film in a vacuum causes diffusion of oxygen from the anodic oxidation film into the lower electrode material. This phenomenon becomes pronounced when tantalum (Ta) or tantalum nitride having a strong affinity with oxygen is used for the lower electrode material.

This means that although the diffusion of oxygen from the anodic oxidation film into the lower electrode occurs due to the annealing applied, a new supply of oxygen from the atmosphere to the anodic oxidation film does not take place because the atmosphere is vacuous, thus causing the anodic oxidation film to be deficient in oxygen.

When annealing in a vacuum is applied after formation of the transparent and electrically conductive film made of an oxide film, serving as the upper electrode, diffusion of oxygen from the transparent and electrically conductive film into the anodic oxidation film deficient in oxygen will take place. Hereupon, by applying annealing in a vacuum after formation of the transparent and electrically conductive film at a temperature lower than that at which annealing in a vacuum is applied after formation of the anodic oxidation film, oxygen diffusion from the anodic oxidation film into the lower electrode is minimized, and diffusion of oxygen from the transparent and electrically conductive film into the anodic oxygen film can be made selectively.

Accordingly, the deficiency in oxygen concentration in the vicinity of the lower electrode can be controlled by the first annealing in a vacuum, and the deficiency in oxygen concentration in the vicinity of the upper electrode can be controlled by the second annealing in a vacuum nearly independently. If the second-annealing process is applied in air, oxygen contained in not only the transparent and electrically conductive film but also the atmosphere is taken into the anodic oxidation film via the transparent and electrically conductive film, causing an excess supply of oxygen, and hence such a practice is not suited for controlling oxygen deficiency.

In the case of a thin film diode using a metallic film instead of the transparent and electrically conductive film for the upper electrode, formation of the upper electrode after annealing in a vacuum applied to the anodic oxidation film causes a problem of leakage occurring with a current-voltage characteristic of the thin film diode due to diffusion of excess oxygen occurring in the anodic oxidation film simultaneously with an increase in oxygen deficiency.

By applying the annealing process in a vacuum twice as described above under the optimum conditions, excess oxygen in the anodic oxidation film, affecting the density of traps causing the characteristic shift of elements, and oxygen deficiency in the anodic oxidation film, dominating the Poole Frenkel conductivity characteristic of the thin film diodes, can be controlled, leading to minimization of the characteristic shift of the thin film diode elements and to optimum adjustment of the current-voltage (I-V) characteristic for driving liquid crystal cells.

The primary cause for the after-image phenomenon, that is, image-sticking occurring in LCDs provided with thin film diodes as switching elements is that the I-V characteristic of the thin film diode elements undergo a shift (I-V characteristic shift) corresponding to applied voltages.

By way of example, the image-sticking phenomenon occurring in a panel LCD driven in normally white display mode is described hereafter. Assume a case of a black display window B being displayed in the middle of a half-tone display region A as shown in FIG. 11.

Figure 12:
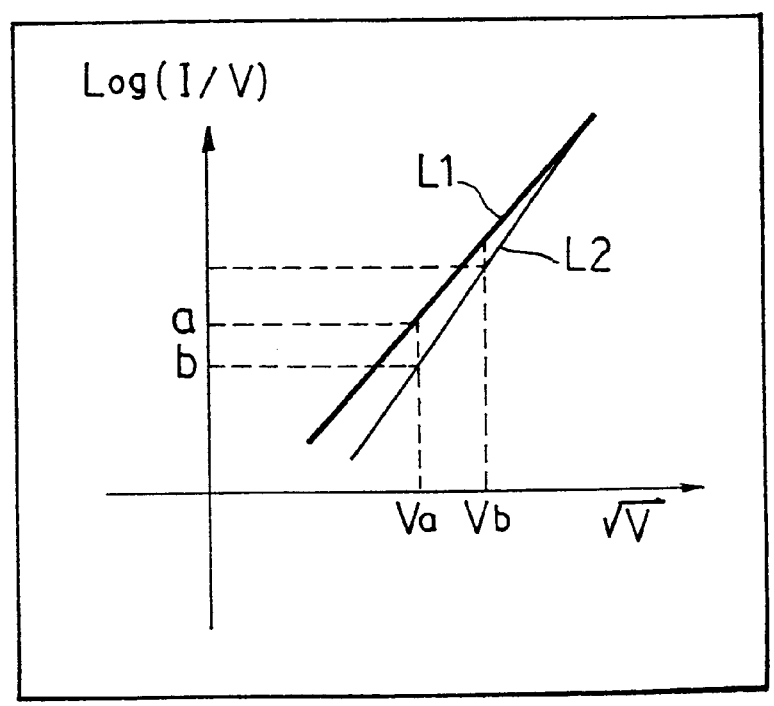

A schematic representation of the I-V characteristic of a thin film diode is closely analogous to a straight line on a plot of $\sqrt{V}$–Log(I/V) of the thin film diode as shown in FIG. 12 since the I-V characteristic of the thin film diode conforms basically to the Poole Frenkel conductivity characteristic. When a voltage applied to the thin film diode having a characteristic as represented by a straight line L1 of FIG. 12 is maintained, the characteristic of the thin film diode shifts to a straight line L2 depending on the waveform of the applied voltage and duration of energization. In FIG. 12, Va indicates a voltage applied for half-tone display and Vb a voltage applied for black display.

Figure 11:
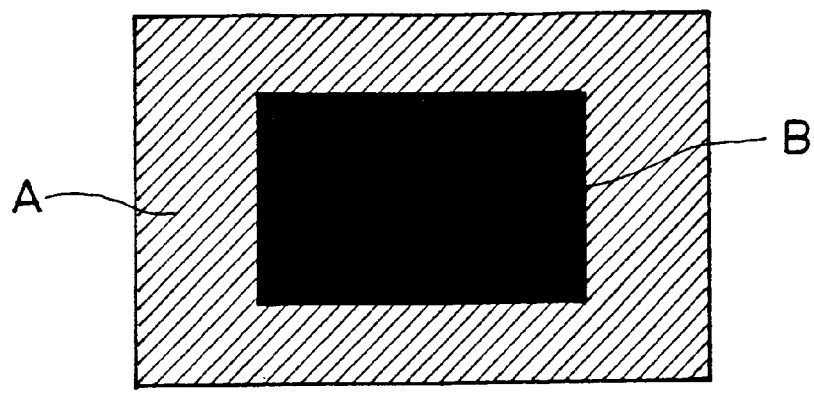
FIGS. 11 and 12 show a window pattern, and a characteristic of the thin film diode, respectively, for description of the after-image phenomenon.

Accordingly, in normally white mode, the characteristics of the thin film diodes for pixels disposed within the black display window B shown in FIG. 11 are caused to shift to the straight line L2 as shown in FIG. 12.

When the entire display is driven for half-tone displaying thereafter, the characteristics of thin film diodes at pixels disposed within the half-tone display region A in FIG. 11 remain as represented by L1 in FIG. 12 with Log (I/V) value at a, however, the characteristics of the thin film diodes at the pixels within a display region corresponding to the black display window B as in FIG. 11 shift to L2 as in FIG. 12, and hence, Log (I/V) becomes b As a result, the display region corresponding to the black display window B in FIG. 11 shifts to white display, resulting in half-tone display.

This means that even when the same voltage for half-tone displaying is applied to the entire LCD, a display image corresponding to the black display window B as shown in FIG. 11 remains, which is the image-sticking phenomenon caused by the characteristic shift of a thin film diode.

In this example, the thin film diode characteristic is assumed to shift in the direction of reverse bias when a voltage is applied. Even when the thin film diode characteristic shifts in the direction of forward bias, the image-sticking phenomenon due to reversal of negative/positive as described above occurs.

Figure 13:
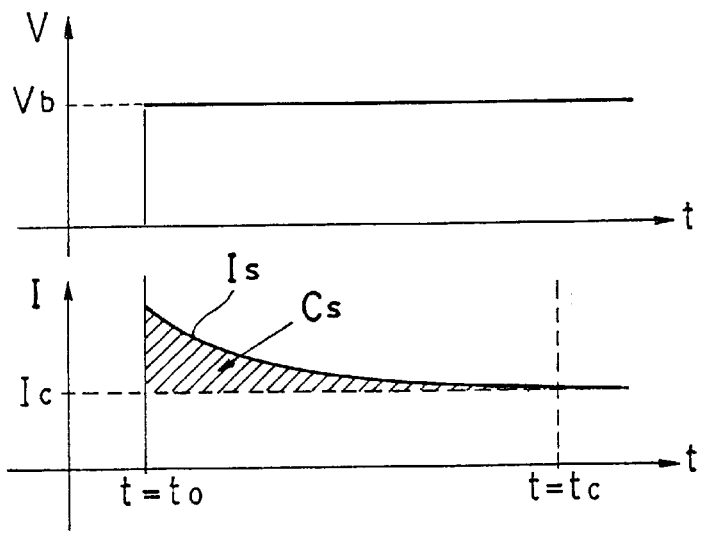
FIG. 13 is a diagram for describing a shift charge for use in assessment of the after-image phenomenon occurring in the LCD.

Accordingly, a quantity called shift charge is newly introduced in order to quantify the characteristic shift of a thin film diode, and a method of determining the same is described hereafter with reference to FIG. 13.

When a step-up voltage varying from 0 V at t<t0 to Vb V at t≧t0 is applied to a thin film diode element, electric current (I=Is) flowing through the thin film diode element undergoes changes as shown in FIG. 13. FIG. 13 shows an example wherein electric current decreases with time by applying a voltage. It has turned out that when the step-up voltage Vb is applied for a given length of time, electric current values converge to a constant value, that is, substantially to Ic at t=tc. Thereupon, a quantity of charge corresponding to the diagonally shaded area in FIG. 13 is defined as shift charge Cs represented by $$Cs = \int_{t_0}^{t_c} (I - Ic) dt$$

The shift charge has a negative value in the case of a thin film diode to be evaluated showing a characteristic of an increase in current by applying a voltage at Vb. Normally, an absolute value of Cs is defined as shift charge.

Then, using a thin film diode 5 μm square, a shift charge thereof is calculated by choosing a value of voltage Vb such that a current value at tc=200 sec is about $3 \times 10^{-7}$ A on the basis of t0=0 sec, and tc=200 sec. Accordingly, a specific value of voltage Vb needs to be chosen depending on the I-V characteristic of the thin film diode to be evaluated. Furthermore, as the I-V characteristic of a thin film diode becomes asymmetrical depending on the direction of the voltage applied, the value of voltage Vb needs to be changed depending on the direction of a voltage applied.

By use of this method, it is now possible to evaluate the I-V characteristics of various thin film diodes by the same yardstick, that is, a scalar quantity called shift charge even if their I-V characteristics vary from one to another.

Figure 14:
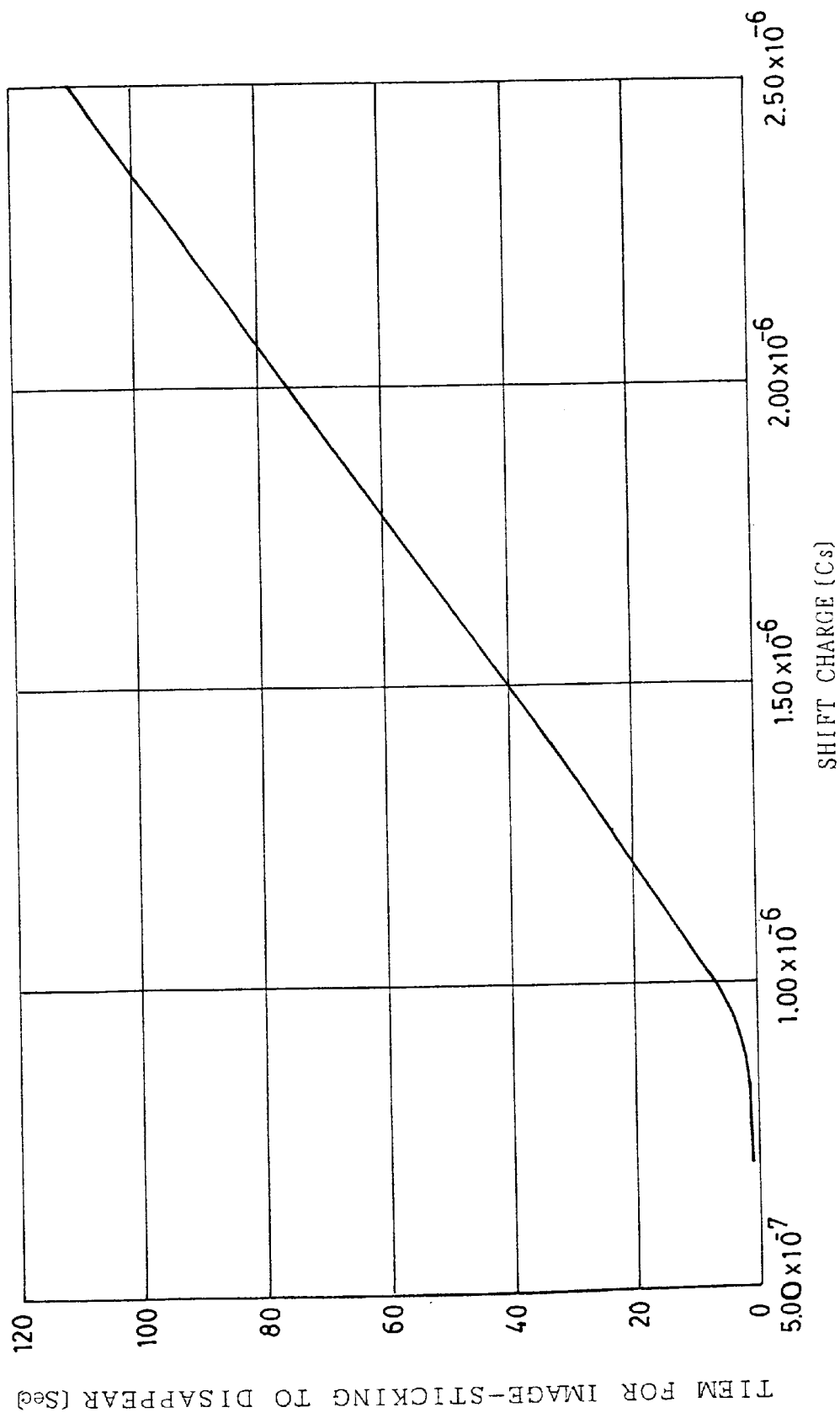
FIG. 14 is a diagram showing a relationship between the shift charge and time for image-sticking to disappear.

FIG. 14 shows a relationship between the shift charge Cs and time for image-sticking to disappear in the case of an LCD being driven. The time for image-sticking to disappear referred to in FIG. 14 is defined as follows:

Light transmissivity (T100) attained when a voltage in driving waveform for white display is applied to an LCD of normally white display mode for 10 minutes is taken as 100%. Then, a voltage for half-tone display attaining 50% transmissivity on the above basis is applied to the LCD for another 10 minutes, and the transmissivity attained for the above period is denoted by T50. Subsequently, a voltage for black display attaining 10% transmissivity is applied for a further 10 minutes, and the transmissivity attained when the same voltage as applied for attaining 50% transmissivity previously is again applied is denoted by Tb %. The time for image-sticking to disappear is defined as the time meeting a formula expressed by $$|Tb - T50| \leq 1\%$$

As shown in FIG. 14, it has turned out that the smaller the value of shift charge Cs, the shorter the time for image-sticking to disappear becomes, confirming that the image-sticking occurring in a thin film diode can be evaluated on the basis of a value of shift charge Cs.

In the case of a thin film diode comprising the transparent and electrically conductive film for the upper electrode, a shift charge Cs (−) obtained when a negative voltage is applied to the upper electrode normally differs from a shift charge Cs (+) obtained when a positive voltage is applied. Therefore, a shift charge Cs determined by the following formula is used as an expediency for evaluation:

$$Cs = [Cs(-) + Cs(+)]/2$$

Figure 15:
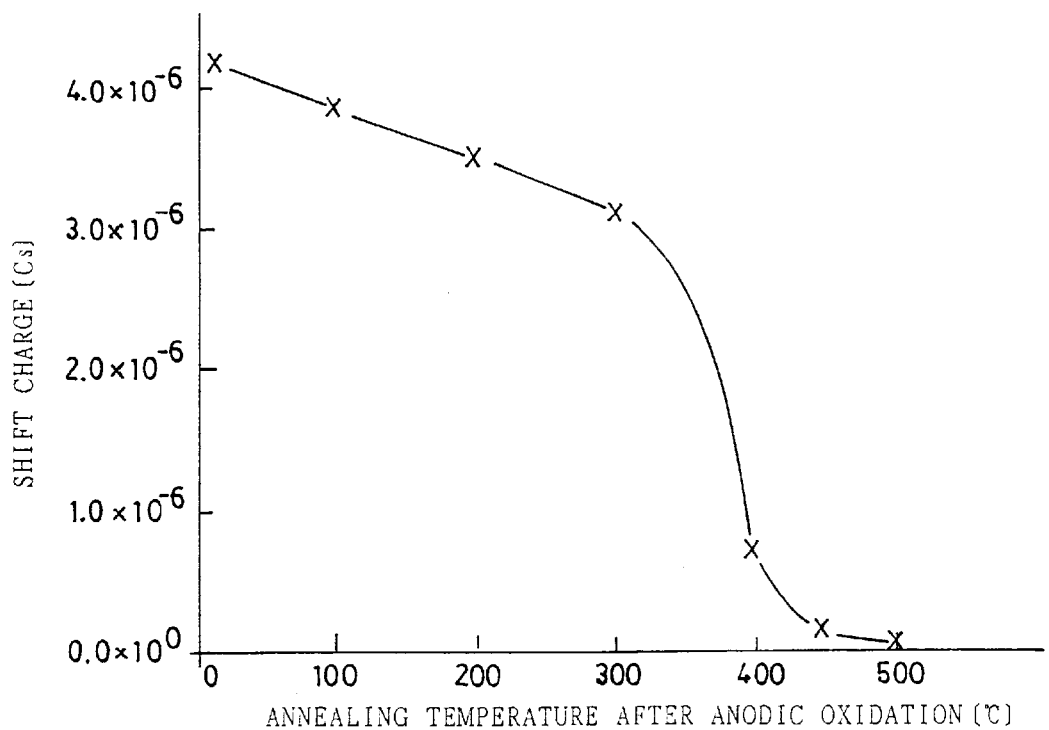
FIG. 15 is a diagram showing a characteristic of differences in the shift charge Cs with respect to temperature differences of the annealing (second time) carried out in a vacuum after the anodic oxitation.

FIG. 15 shows a result of plotting the obtained shift charge Cs in accordance with the temperature change of the annealing carried out in a vacuum after the anodic oxidation film is formed.

In FIG. 15, the temperatures (C.°) when the first annealing process is carried out in a vacuum after formation of the anodic oxidation film are indicated on the axis of the abscissa and the shift charge Cs when the annealing process is carried out at the respective temperatures is indicated on the axis of the ordinate.

As is obvious from the result, the shift charge Cs is decreased to a greater extent in the case where the annealing is applied at the respective temperatures, compared with the case where the annealing is not applied (plotted at 23C.° in the drawing).

In particular, in the case of the annealing carried out at a temperature exceeding 400C.°, the value of the shift charge Cs decreases markedly.

Figure 16:
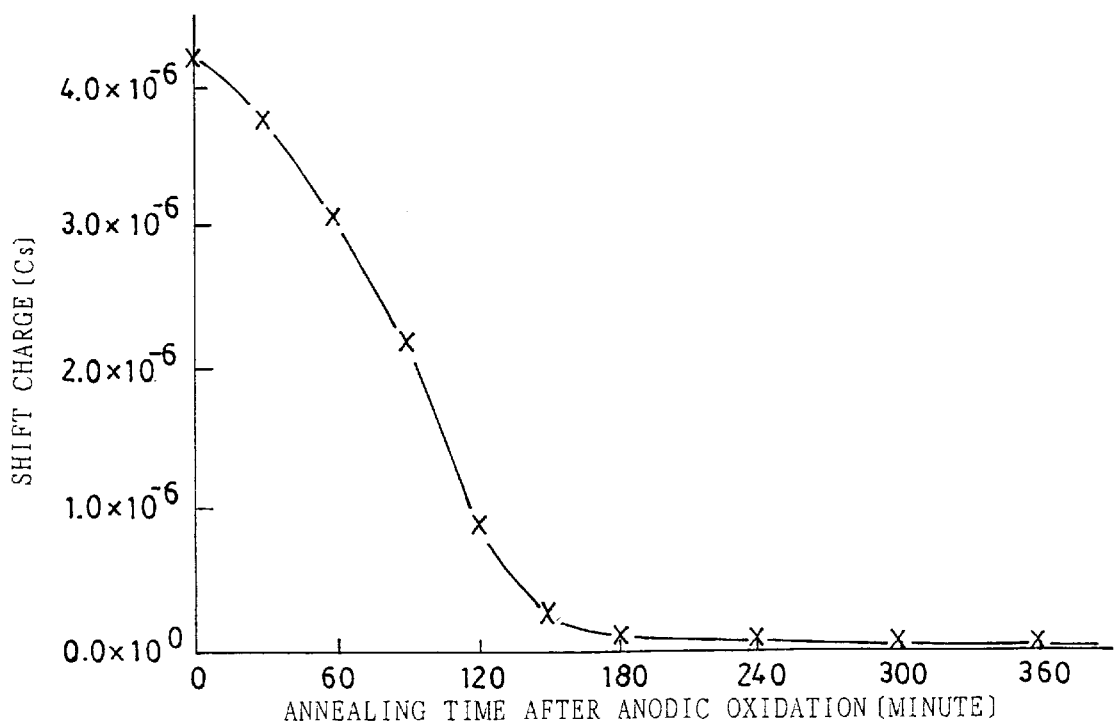
FIG. 16 is a diagram showing a characteristic of differences in the shift charge Cs with respect to time of the annealing (second time) carried out in a vacuum after the anodic oxitation.

FIG. 16 shows a result of plotting the obtained shift charge Cs in accordance with the change of time for the annealing carried out in a vacuum after the anodic oxidation film is formed.

In FIG. 16, the time (minutes) for the first annealing carried out after formation of the anodic oxidation film in a vacuum is indicated on the axis of the abscissa and the shift charge Cs when the annealing process is carried out for the respective time is indicated on the ordinate axis.

As is obvious from the result, the shift charge Cs is decreased to a greater extent in the case where the annealing is applied for the respective times, compared with the case where the annealing is not applied (plotted at 0 min in the drawing). In particular, in the case of the annealing carried out for more than 120 min (two hours), the value of the shift charge Cs decreases markedly.

Consequently, in case of LCDs provided with the thin film diodes fabricated by the method according to the invention as switching elements, duration of the image-sticking is drastically reduced.

For example, when the whole display is changed over to half-tone display after driving an LCD for displaying a monochromatic window pattern for 3 minutes or 30 minutes, the time required for the image-sticking to disappear by visual inspection is reduced to 1 second or less, or 1 to 2 seconds, respectively, in the case of an LCD using the thin film diodes fabricated by the method according to the invention whereas the same was as long as 25 seconds or 5 minutes, respectively, in the case of an LCD using thin film diodes fabricated by the conventional method.

This means that in normal driving condition, the image-sticking is barely noticeable with LCDs using the thin film diodes fabricated by the method according to the invention.

Therefore, the method according to the invention is suited for the fabrication of thin film diodes to be incorporated in LCDs for use, for example, in portable personal computers and particularly, in LCDs having expanded display functions.

Figure 17:
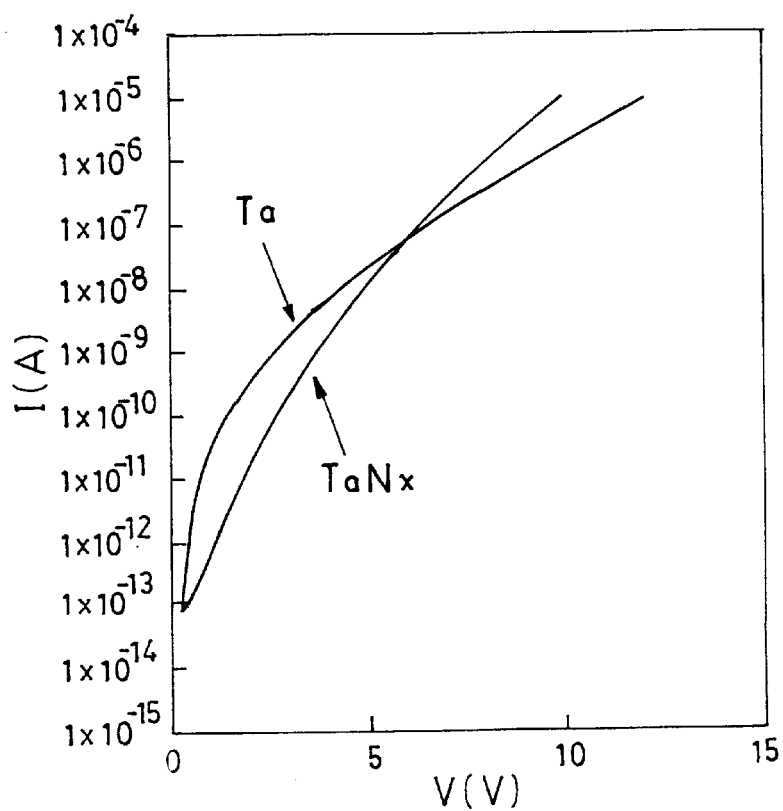
FIG. 17 is a diagram showing a current-voltage characteristic in the case of using the tantalum nitride as the lower electrode material and in the case of using tantalum added with nothing in the first embodiment.

The current-voltage characteristic in the case (curve TaNx) where the tantalum nitride is used as the material of the lower electrode of the thin film diode shows that the OFF voltage increases at the same time the ON voltage decreases, making a sharp curve, compared with the case (curve Ta) where the tantalum added with nothing is used as shown in FIG. 17. Hereupon, in FIG. 17, provided the current when a voltage of 2.5 V is applied is I off, the current when a voltage of 10 V is applied is I on, and the on/off ratio is I on/I off, the on/off ratio in the case where the tantalum added with nothing is used is about $2 \times 10^3$ while the on/off ratio in the case where the tantalum nitride is used becomes as great as about $10^5$, which makes a great, steep curve in the graph of the current-voltage characteristics.

Although the voltage is applied so that the upper electrode can be positive with respect to the lower electrode of the thin film diode in FIG. 17, the voltage may be applied on the contrary so that the upper electrode can be negative with respect to the lower electrode, which results in the same effect in the current-voltage characteristics.

Thus, it is possible to improve the switching characteristics by the increased sharpness thereof and to display an image with excellent quality.

[Second Embodiment: FIGS. 18 to 33]

A method of fabricating a thin film diode according to a second embodiment of the invention is described hereafter with reference to FIGS. 18 to 32. The second embodiment relates to a method of fabricating a pair of thin film diodes formed between a signal electrode and a pixel electrode of an LCD so as to be connected in series (back to back) to each other in opposite directions.

Figure 28:
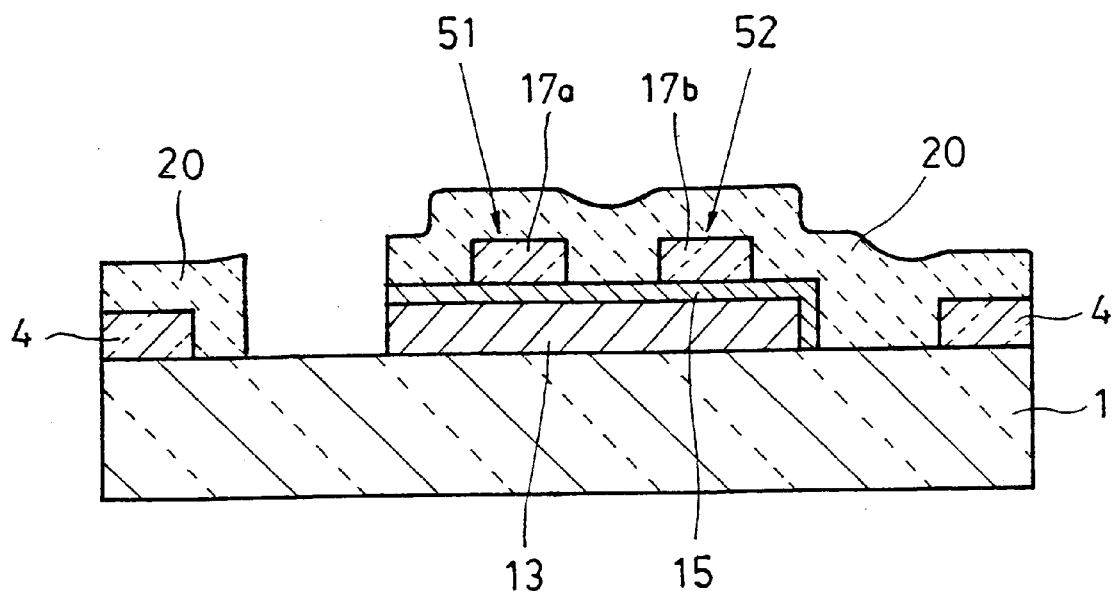
Figure 29:
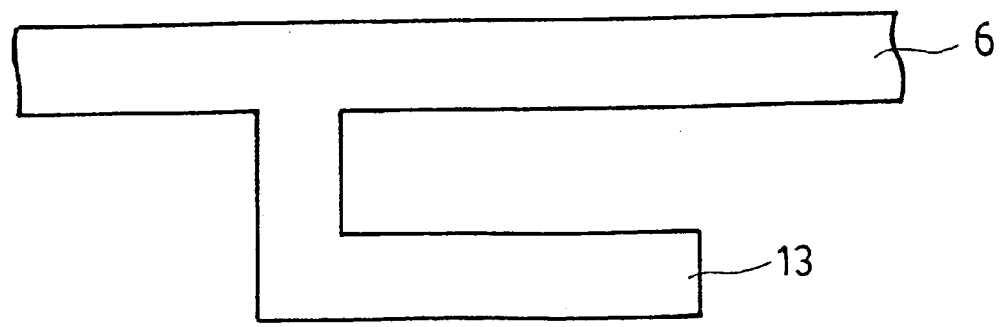
FIG. 29 is a plan view showing a relationship between a signal electrode and a lower electrode.
Figure 30:
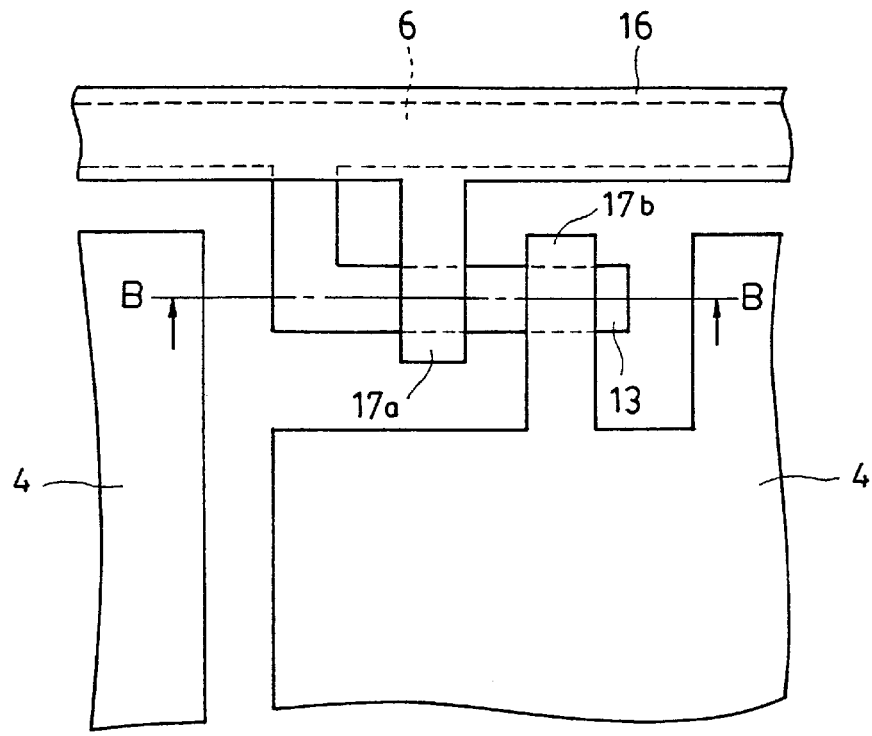
FIG. 30 is a partial plan view of the LCD showing a midway step of the method of fabricating the thin film diode according to the second embodiment of the invention.
Figure 31:
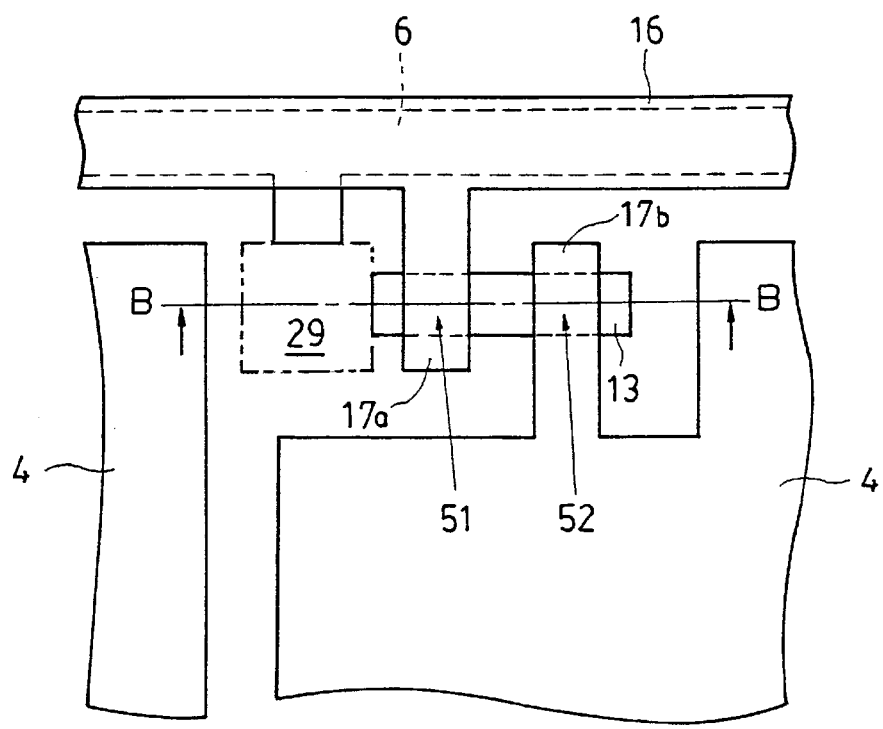
FIG. 31 is a partial plan view of the LCD showing a completion state of the aforesaid method.
Figure 32:
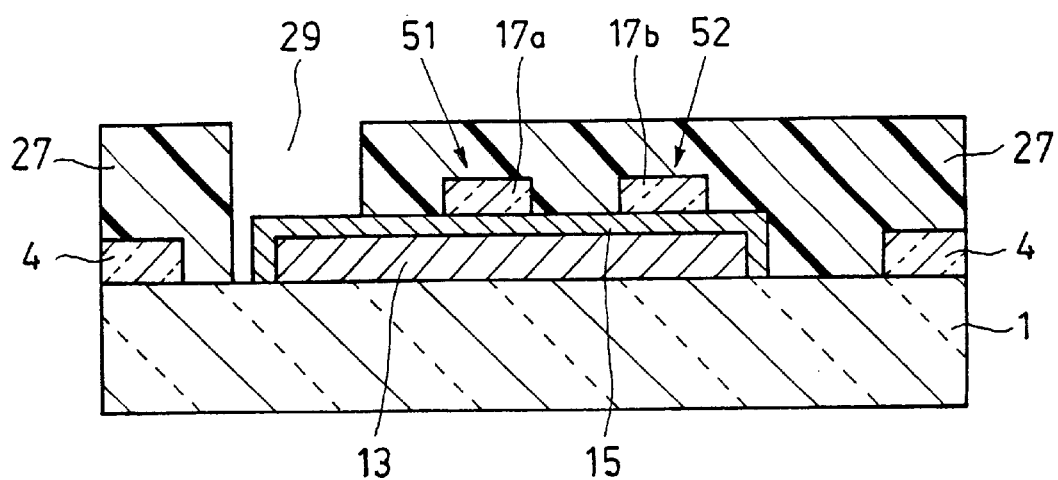
FIG. 32 is an enlarged sectional view corresponding to FIG. 26 in the case where an overcoating film is not provided.

FIG. 31 is a partial plan view of the LCD provided with the pair of the thin film diodes, FIG. 30 a similar plan view showing an intermediate step of the fabrication process, and FIG. 29 a plan view illustrating explicitly a relation between the signal electrode and a lower electrode. FIGS. 18 to 28 show respective steps of fabricating the thin film diodes, FIGS. 18 to 26 are enlarged sectional views taken along the line B—B of FIG. 30, and FIGS. 27 and 28 correspond to enlarged sectional views taken along the line B—B of FIG. 31. FIG. 32 is an enlarged sectional view corresponding to FIG. 26 without an overcoating film.

In the aforesaid figures, parts corresponding to those in FIGS. 1 to 9 described in the foregoing are denoted by the same reference numerals.

The construction of the thin film diodes incorporated in an LCD, fabricated by the method according to the second embodiment, is described hereafter with reference to FIGS. 28 and 31.

The pair of thin film diodes (TFD) 51 and 52 are formed on a substrate 1 of the LCD. The thin film diodes 51 and 52 comprise a lower electrode 13 patterned in the shape of an island disconnected from the signal electrode 6, an anodic oxidation film 15 formed on the surface of the lower electrode 13, and a first upper electrode 17a and a second upper electrode 17b, both of which are formed so as to overlie the lower electrode 13 via the anodic oxidation film 15. The second upper electrode 17b is connected with the pixel electrode 4.

Further, an overcoating film 20 is formed covering the surface of the substrate 1, but this may be omitted.

Respective steps of the method fabricating the pair of the thin film diodes 51 and 52 according to the invention are described with reference to FIGS. 18 to 31.

Figure 18:
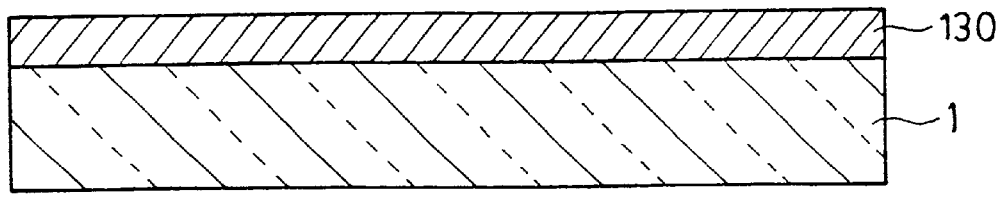
FIGS. 18 to 26 are views showing respective steps of the method of fabricating a thin film diode according to a second embodiment of the invention, corresponding to an enlarged sectional view taken along the line B—B in FIG. 30.

As shown in FIG. 18, a tantalum nitride film as a lower electrode material film 130 is formed first to a thickness of 100 nm on the entire surface of a substrate 1 (corresponding to the first substrate 1 in FIG. 34) made of an insulation glass. The tantalum film is formed by means of a reactive-sputtering process targeting a tantalum target and controlling the sputtering pressure to 6 mTorr and applied in an atmosphere of a mixture of 95% argon and 5% nitrogen as a reaction gas.

Figure 19:
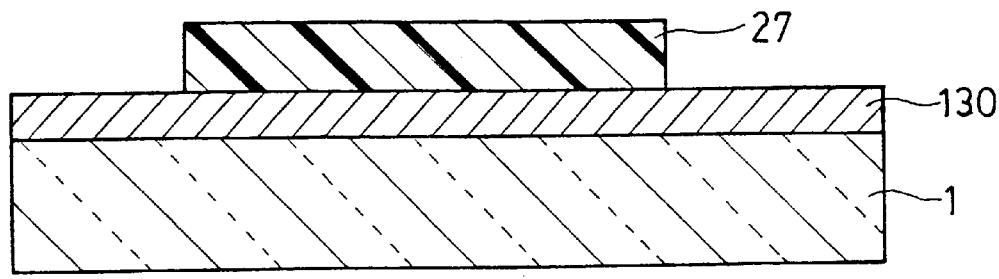

Then, a positive type photoresist is formed on the entire surface of the lower electrode material film 130 by use of a spin coater and as shown in FIG. 19, a photoresist 27 patterned in the shape of the lower electrode 13 and the signal electrode 6 is formed by means of a photolithographic processing comprising exposure and development treatments using a photo mask.

Then, the substrate 1 is introduced into an etching chamber of an etching tool provided with parallel plate electrodes, and as etching gases, sulfur hexafluoride (SF6), helium (He), and oxygen ($O_2$) are fed into the etching chamber at a flow rate of 100 cc/min, 100 cc/min, and 50 cc/min, respectively, keeping the pressure inside the etching chamber at 50 mTorr and supplying 500 W of RF power.

Figure 20:
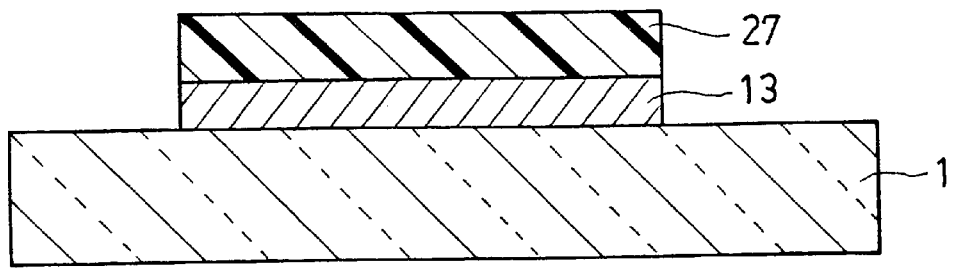

Subsequently, the tantalum nitride film, that is, the lower electrode material film 130 is etched using the photoresist 27 as an etching mask, thereby forming the lower electrode 13 of the thin film diodes as shown in FIG. 20 and the signal electrode 6 as shown in FIG. 29.

After the etching treatment, the lower electrode 13 and the signal electrode 6 are formed in a plane pattern such that the lower electrode 13 protrudes from the signal electrode 6 in a form substantially resembling the letter L as shown in the plan view of FIG. 29.

Figure 21:
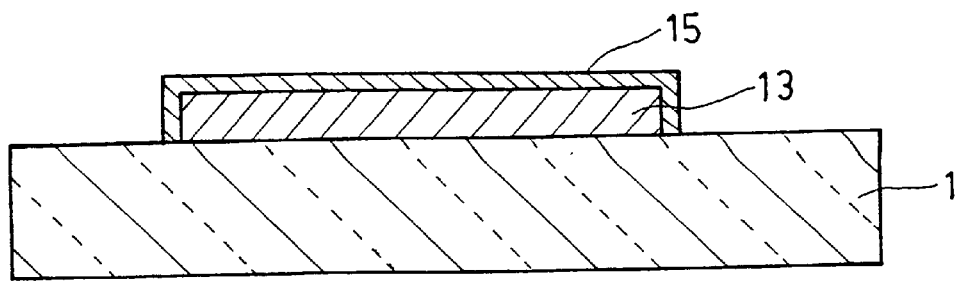

Then, as shown in FIG. 21, the anodic oxidation film 15 is formed on the surface of the lower electrode 13.

An anodic oxidation treatment for forming the anodic oxidation film 15 is applied using an aqueous solution of ammonium borate as the anodic oxidation solution. Specifically, the substrate 1 is immersed in an oxidation cell filled up with the anodic oxidation solution, and a DC voltage from a DC power source is applied between a platinum cathode and the lower electrode 13 serving as anode via the signal electrode 6.

Hereupon, an anodic oxidation voltage (the DC voltage described above) is set at 12 V such that the anodic oxidation film 15 is formed to a thickness of 25 nm by increasing the voltage at a rate of 0.2 V/min and maintaining a hold voltage for one hour. In the plan views of FIGS. 30 and 31, the anodic oxidation film 15 is not shown.

Thereafter a first annealing process in a vacuum is applied to the substrate 1 with the anodic oxidation film 15 formed thereon. The first annealing process is carried out under conditions of a degree of vacuum at 1×10⁻⁵ Torr or less, a temperature in the range of 400° C. to 500° C., and a heating time for 120 minutes (two hours) or longer (preferably, for about three to six hours).

Figure 22:
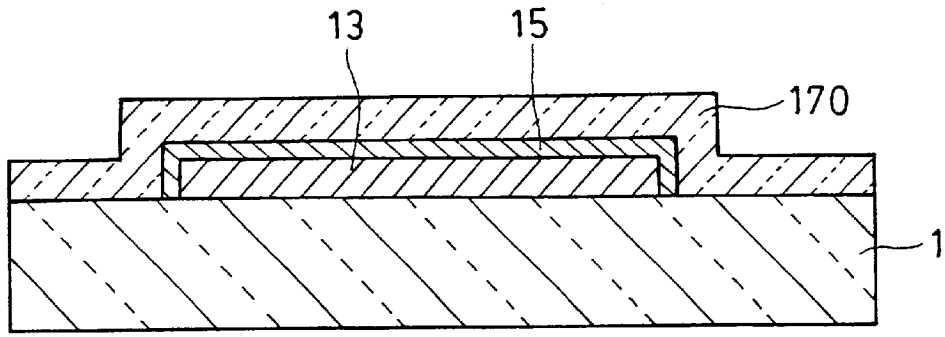

After the first annealing is applied, a transparent and electrically conductive film made of indium tin oxide (ITO) as an upper electrode material film 170 is formed on the entire surface of the substrate 1 as shown in FIG. 22. The upper electrode material film 170 made of ITO is formed to a thickness of 100 nm by means of the sputtering process wherein an argon gas containing 0.5 to 1% of oxygen is fed into a sputtering chamber and a sputtering pressure is controlled to 10 mTorr.

Subsequently, a second annealing process in a vacuum is applied to the substrate 1 with the upper electrode material film 170 formed thereon. The second annealing process is carried out under conditions of a degree of vacuum at 1×10⁻⁵ Torr or less, a temperature of 400° C., and a processing time for 120 minutes (two hours).

Figure 23:
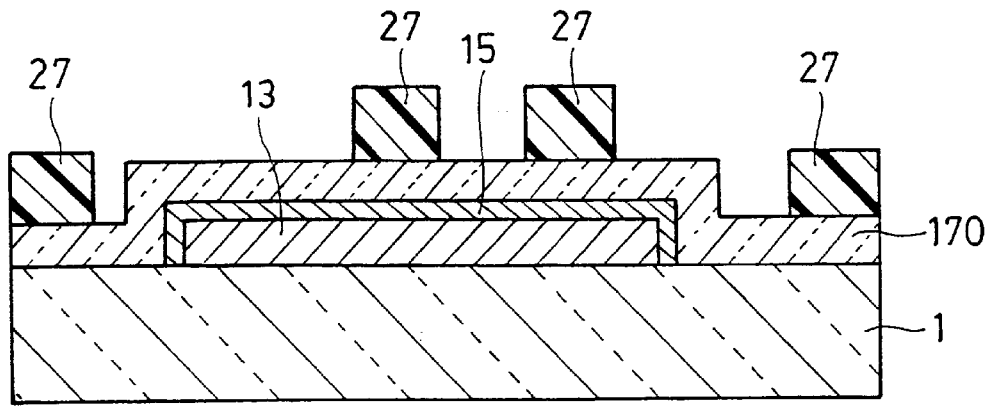

After the second annealing process is applied to the substrate 1, a photoresist is formed on the entire surface of the upper electrode material film 170 by use of the spin coater and as shown in FIG. 23, a photoresist 27 patterned in the shape of the first upper electrode 17a, the second upper electrode 17b, and the pixel electrode 4 is formed by means of the photolithographic process comprising exposure and development treatments using a photo mask.

Figure 24:
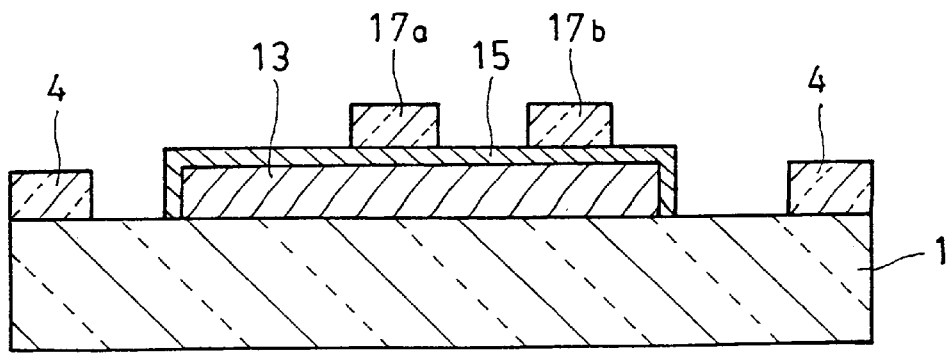

As shown in FIG. 24, the first upper electrode 17a, the second upper electrode 17b, and the pixel electrode 4 are formed by patterning on the upper electrode material film 170 using the photoresist 27 as an etching mask. The etching of the upper electrode material film 170 made of indium tin oxide is carried out in a wet etching system using a mixture of ferric chloride and hydrochloric acid.

Thereafter, the photoresist 27 used as an etching mask is removed in a wet-type resist stripping system using a mixed solution of sulfuric acid and hydrogen peroxide. FIG. 24 shows the condition of the substrate 1 after removal of the photoresist 27.

As shown in the plan view of FIG. 30, the first upper electrode 17a, the second upper electrode 17b, and the pixel electrode 4 are formed in a plane pattern such that the second upper electrode 17b overlying the lower electrode 13 is formed by extending a part of the region for the pixel electrode 4 so as to cross the lower electrode 13 at right angles thereto, and the first upper electrode 17b overlying the lower electrode 13 is formed by extending a band-like electrode 16 formed to overlie the signal electrode 6 in such a way as to cross the lower electrode 13 at right angles thereto.

Figure 25:
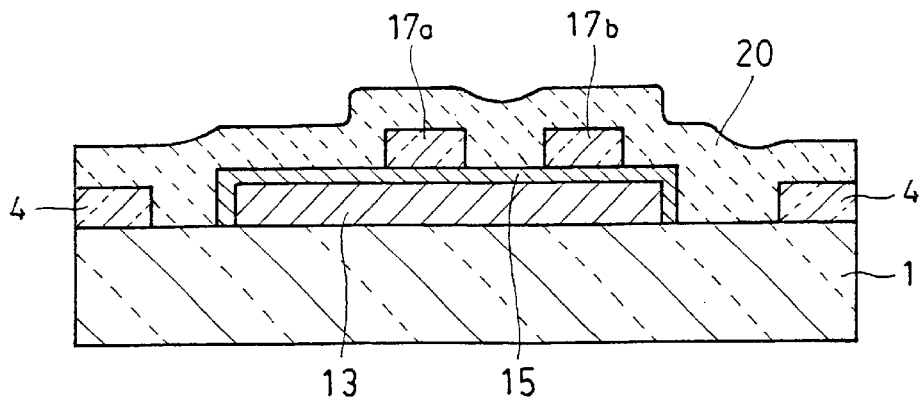

Then, as shown in the sectional view of FIG. 25, an overcoating film 20 made of tantalum oxide is formed covering the entire surface of the substrate 1. The overcoating film 20 is formed to a thickness of 100 nm by means of the sputtering process wherein an argon gas containing 3% oxygen is fed into the vacuum chamber at a pressure of 5 mTorr.

The overcoating film 20 is provided to prevent short-circuiting from occurring between two substrates, that is, the signal electrode 6 and the pixel electrode 4 on the substrate 1 on which the thin film diodes 51 and 52 are formed, on one hand, and facing electrodes on the substrate opposing the substrate 1 on the other hand.

Figure 26:
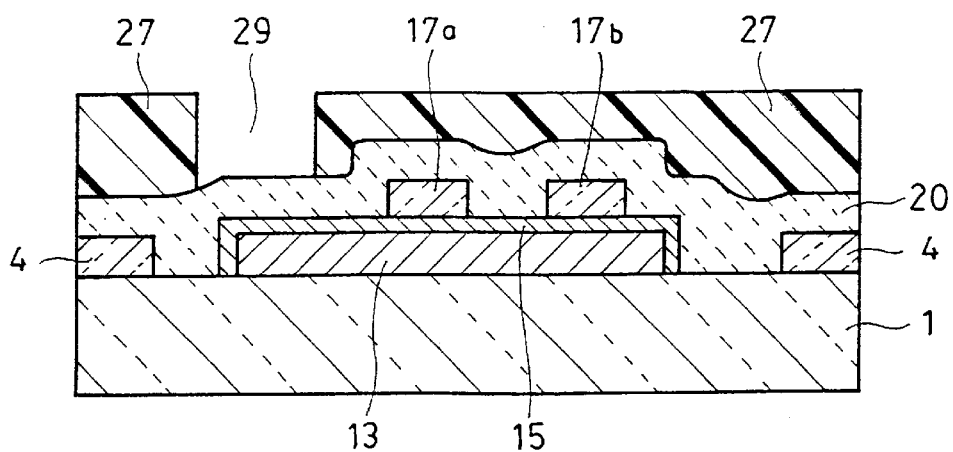

Subsequently, a photoresist is formed on the entire surface of the overcoating film 20 by use of the spin coater and as shown in FIG. 26, a photoresist 27 patterned such that an opening region 29 is exposed is formed by means of the photolithographic process comprising exposure and development treatments using a photo mask.

As shown by imaginary lines in FIG. 31, patterning is provided such that the opening region 29 corresponds to a bend of the lower electrode 13 protruding in a form resembling the letter L from the signal electrode 6.

Thereafter, the substrate 1 is introduced into an etching chamber of an etching tool provided with parallel plate electrodes, and as etching gases, sulfur hexafluoride ($SF_6$), helium (He), and oxygen ($O_2$) are fed into the etching chamber at a flow rate of 200 cc/min, 20 cc/min, and 30 cc/min, respectively, keeping the pressure inside the etching chamber at 50 mTorr and supplying 1 kW of RF power, and a tantalum oxide film serving as the overcoating film is etched using the photoresist 27 as an etching mask.

Figure 27:
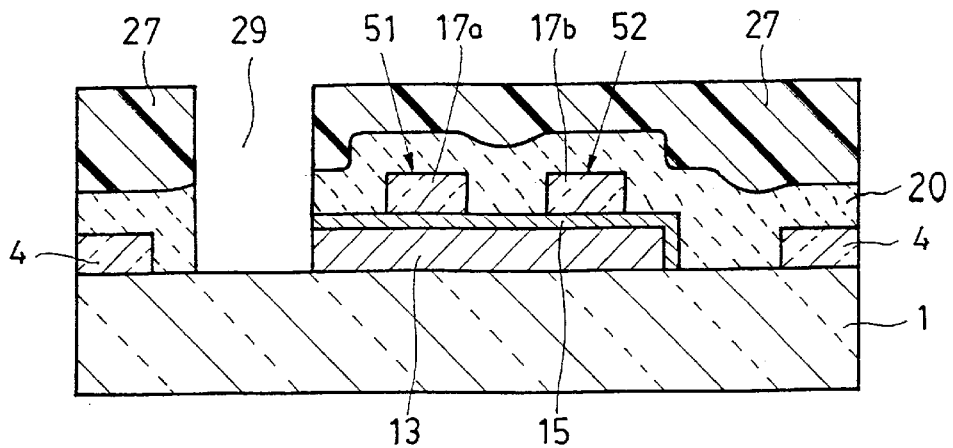
FIGS. 27 and 28 are views showing a last processing step of the method of fabricating the thin film diode and a completion state thereof, respectively, corresponding to an enlarged sectional view taken along the line B—B in FIG. 31.

Subsequently as shown in FIG. 27, the anodic oxidation film 15 and the lower electrode 13 within the opening region 29 are removed by etching, causing the lower electrode 13 to be formed in a pattern of an island disconnected from the signal electrode 6 as shown in FIG. 31.

Then, the photoresist 27 used as an etching mask is removed in a wet-type photoresist stripping system using a mixture of sulfuric acid and hydrogen peroxide. FIG. 28 is a sectional view showing a completed state after removal of the photoresist 27.

Thus the pair of thin film diodes 51 and 52 each comprising the lower electrode 13 composed of a tantalum nitride film, the anodic oxidation film 15 composed of a tantalum oxide film, and the first upper electrode 17a and the second upper electrode 17b, respectively composed of a transparent and electrically conductive film, are formed between the signal electrode 6 and the respective pixel electrodes 4 on the substrate 1.

The pair of thin film diodes fabricated between the signal electrode 6 and the respective pixel electrodes 4 by the method according to this embodiment comprise the first thin film diode 51 composed of an "indium tin oxide-tantalum oxide-tantalum nitride" structure, and the second thin film diode 52 composed of a "tantalum nitride-tantalum oxide-indium tin oxide" structure.

Accordingly, electric current flows from "indium tin oxide-tantalum oxide-tantalum nitride" of the first thin film diode 51 to "tantalum nitride-tantalum oxide -indium tin oxide" of the second thin film diode 52 via a current path from the signal electrode 6 to the pixel electrode 4.

This means that the electrical connection from the signal electrode 6 to the pixel electrode 4 through the first thin film diode 51 and the same from the pixel electrode 4 to the signal electrode 6 through the second thin film diode 52 are symmetrical.

By adoption of a back-to-back connection structure for the pair of thin film diodes 51 and 52, the current-voltage characteristic of the thin film diodes becomes symmetrical in both directions of applied voltage.

As a result, further improvement to the after-image phenomenon caused by stationary patterns remaining on the liquid crystal display is achieved, and the merit of a reduction in the cost of a driving power source is also gained.

Similar to the case of the first embodiment of the invention, a marked improvement in the after-image phenomenon occurring in LCDs using the thin film diodes fabricated by the method according to the second embodiment is achieved.

Figure 33:
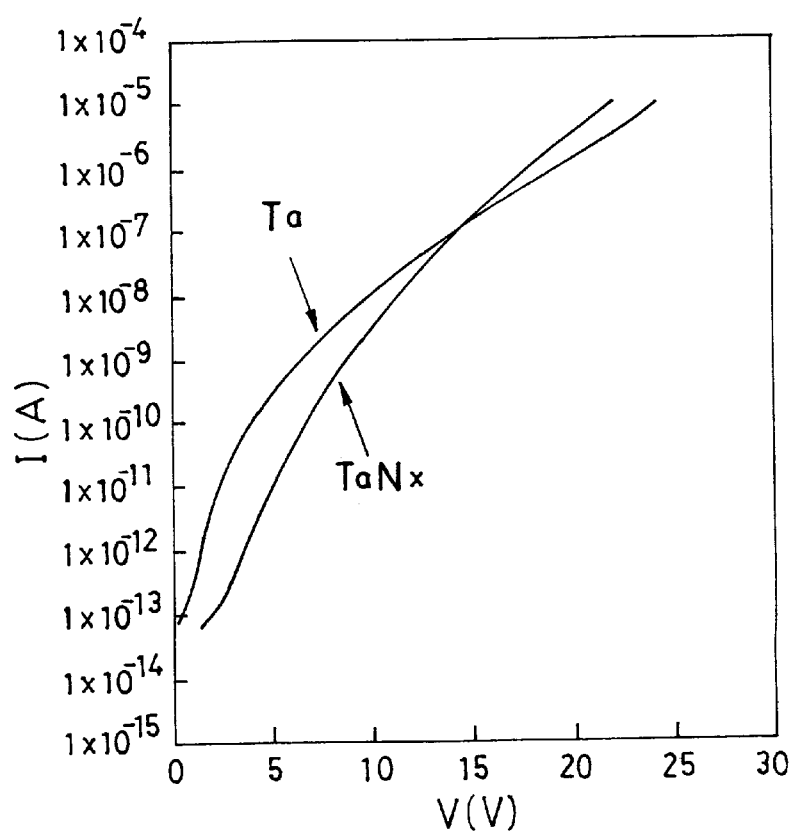
FIG. 33 is a diagram showing a current-voltage characteristic in the case of using tantalum nitride as the lower electrode material and in the case of using tantalum added with nothing in the second embodiment.

Further, the current-voltage characteristic in the case (curve TaNx) where the tantalum nitride is used as the material of the lower electrode of the thin film diode shows that the OFF voltage increases at the same time the ON voltage decreases, making a sharp curve, compared with the case (curve Ta) where the tantalum added with nothing is used as shown in FIG. 33. Hereupon, in FIG. 33, provided the current when a voltage of 5 V is applied is I off, the current when a voltage of 20 V is applied is I on, and the on/off ratio is I on/I off, the on/off ratio in case where the tantalum added with nothing is used is about $5 \times 10^3$ while the on/off ratio in case where the tantalum nitride is used becomes so great as about $3 \times 10^5$, which makes a great, steep curve in the graph of the current-voltage characteristics. By the increased sharpness, it is possible to improve the switching characteristics and to display an image with excellent quality.

As shown in FIG. 21, a case of using ammonium borate for the anodic oxidation solution is described by way of example when applying the anodic oxidation treatment to form the anodic oxidation film 15 on the surface of the lower electrode 13. However, phosphoric acid or ammonium phosphate may also be used for the anodic oxidation solution. Alternatively, citric acid used in the conventional method may also be used.

Further, the second annealing process applied after formation of the upper electrode material film 170 on the substrate 1 composed of the transparent and electrical conductive film and before patterning of the first and second upper electrodes 17a and 17b, and the pixel electrode 4 may be applied after patterning of the first and second upper electrodes 17a and 17b, and the pixel electrode 4.

The steps of fabrication according to the second embodiment may be modified so that thin film diodes without the overcoating film 20 can be fabricated.

In this case, the respective steps as shown in FIGS. 18 to 24 are the same. After patterning the first and second upper electrodes 17a and 17b, and the pixel electrode 4 as shown in FIG. 22, a photoresist is formed on the entire surface of the substrate 1 by use of the spin coater without forming the overcoating film 20.

Subsequently, as shown in FIG. 32, a photoresist 27 is patterned such that an opening corresponding to an opening region 29 is defined in the photoresist 27 by means of the photolithographic process comprising exposure and development treatments using a photo mask. As shown by imaginary lines in FIG. 31, patterning is provided such that the opening region 29 corresponds to a bend of the lower electrode 13 protruding in a form resembling the letter L from the signal electrode 6.

Subsequently in the same way as described in the foregoing with reference to FIG. 27, the anodic oxidation film 15 and the lower electrode 13 within the opening region 29 are removed by etching using the photoresist as an etching mask, causing the lower electrode 13 to be formed in the pattern of an island disconnected from the signal electrode 6. Then, the photoresist 27 used as an etching mask is removed in a wet-type photoresist stripping system using a mixture of sulfuric acid and hydrogen peroxide.

By modifying the processing steps as described above, the pair of thin film diodes 51 and 52 may be formed between the signal electrode 6 and the respective pixel electrodes 4 on the substrate 1.

The overcoating film 20 may be formed later as necessary.

In the embodiments described in the foregoing, although use of indium tin oxide (ITO) for the upper electrode material is described by way of example, use of indium oxide ($In_2O_3$), zinc oxide ($ZnO_2$), tin oxide ($SnO_2$), or an oxide containing indium as a main constituent may also achieve the same effect.

Further, by way of example, use of a tantalum oxide film for a coating film is described, however, use of a silicon oxide film, a silicon nitride film or a silicon nitride oxide film may be equally effective. In addition, spin on glass (SOG) may also be used as a material of the overcoating film. The silicon oxide glass is a mixture of silicon oxide and a solvent, and it is formed by applying the mixture to the substrate by use of a spin coater, and is subject to the annealing at 250 to 300° C., then evaporation of the solvent in the SOG film.

In the foregoing, although examples were given wherein one or two thin film diodes are formed between the signal electrode and the pixel electrode, three or more (preferably an even number) thereof may be formed.

Although the tantalum nitride film is formed by means of a reactive sputtering process in an atmosphere of a mixture gas of 95% argon and 5% nitrogen in the above description of the respective embodiments, it was confirmed in the experiment by the inventors that the same effect can be obtained in this method of manufacturing the thin film diode according to the present invention even when the tantalum nitride film is formed by the reactive sputtering method in an atmosphere of a mixture gas of 5 to 50% nitrogen.

A brief description is made hereafter of a method of manufacturing a flat-panel LCD using the substrate on which the thin film diodes, the signal electrodes, and the pixel electrodes are formed as described in the foregoing.

Alignment layers are formed on the second substrate with facing electrodes formed thereon as well as on the first substrate with the thin film diode elements and the like formed thereon, respectively. Rubbing is applied to the respective alignment layers to provide preferred orientations, respectively. The two substrates are joined together using a sealant with a spacer made of fiber-glass interposed in-between, and liquid crystals are injected in a gap between the substrates. Polarizers are disposed on the external faces of the respective substrates such that respective polarization axes cross at right angles to one another.

What is claimed is:

1. A method of manufacturing a thin film diode provided in a liquid crystal display, comprising a lower electrode connected with a signal electrode, an anodic oxidation film formed on a surface of the lower electrode, and an upper electrode formed so as to overlie the lower electrode via the anodic oxidation film and connected with a pixel electrode, said method comprising:

a process comprising steps of forming a lower electrode material film of tantalum nitride on a substrate, forming a photoresist on the lower electrode material film, and patterning on the photoresist by applying a photolithographic treatment;

a process of forming the lower electrode and the signal electrode by etching the lower electrode material film using the patterned photoresist as an etching mask;

a process of forming an anodic oxidation film of a tantalum oxide film on the surface of the lower electrode by applying an anodic oxidation treatment to the lower electrode using an anodic oxidation solution;

a first annealing process applied annealing in a vacuum to the anodic oxidation film;

a process of forming an upper electrode material film composed of a transparent and electrically conductive film on an entire surface of the substrate including the surface of the lower electrode with the anodic oxidation film formed thereon;

a second annealing process applied annealing in a vacuum to the substrate with the upper electrode material film formed thereon;

a process comprising steps of forming a photoresist on the upper electrode material film, and patterning on the photoresist by applying the photolithographic treatment; and a process of forming the upper electrode and the pixel electrode by etching the upper electrode material film using the patterned photoresist as an etching mask.

2. The method of manufacturing a thin film diode according to claim 1, wherein the lower electrode material of the tantalum nitride film is formed by a reactive sputtering method using a nitrogen gas as a reaction gas and targeting a tantalum target when the lower electrode material of the tantalum nitride film is formed on the substrate.

3. The method of manufacturing a thin film diode according to claim 2, wherein the first annealing process is carried out at a temperature of 400 to 500° C.

4. The method of manufacturing a thin film diode according to claim 2, wherein the first annealing process is carried out at a temperature of 400 to 500° C. for 120 minutes or longer.

5. The method of manufacturing a thin film diode according to claim 1, further including a process of forming an overcoating film made of an insulation material on the entire surface of the substrate after completion of the process of forming the upper electrode and the pixel electrode.

6. The method of manufacturing a thin film diode according to claim 1, wherein the first annealing process is carried out at a temperature of 400 to 500° C.

7. The method of manufacturing a thin film diode according to claim 1, wherein the first annealing process is carried out at a temperature of 400 to 500° C. for 120 minutes or longer.

8. A method of manufacturing a thin film diode provided in a liquid crystal display, comprising a lower electrode connected with a signal electrode, an anodic oxidation film formed on a surface of the lower electrode, and an upper electrode formed so as to overlie the lower electrode via the anodic oxidation film and connected with a pixel electrode, said method comprising:

a process comprising steps of forming a lower electrode material film of tantalum nitride on a substrate, forming a photoresist on the lower electrode material film, and patterning on the photoresist by applying a photolithographic treatment;

a process of forming the lower electrode and the signal electrode by etching the lower electrode material film using the patterned photoresist as an etching mask;

a process of forming an anodic oxidation film of a tantalum oxide film on the surface of the lower electrode by applying an anodic oxidation treatment to the lower electrode using an anodic oxidation solution;

a first annealing process applied annealing in a vacuum to the anodic oxidation film;

a process of forming an upper electrode material film composed of a transparent and electrically conductive film on the entire surface of the substrate including the surface of the lower electrode with the anodic oxidation film formed thereon;

a process comprising steps of forming a photoresist on the upper electrode material film, and patterning on the photoresist by applying the photolithographic treatment;

a process of forming the upper electrode and the pixel electrode by etching the upper electrode material film using the patterned photoresist as etching mask; and a second annealing process applied annealing in a vacuum to the substrate with the upper electrode and the pixel electrode formed thereon.

9. The method of manufacturing a thin film diode according to claim 8, wherein the lower electrode material of the tantalum nitride film is formed by a reactive sputtering method using a nitrogen gas as a reaction gas and targeting a tantalum target when the lower electrode material of the tantalum nitride film is formed on the substrate.

10. The method of manufacturing a thin film diode according to claim 3, wherein the first annealing process is carried out at a temperature of 400 to 500° C.

11. The method of manufacturing a thin film diode according to claim 3, wherein the first annealing process is carried out at a temperature of 400 to 500° C. for 120 minutes or longer.

12. The method of manufacturing a thin film diode according to claim 8, further including a process of forming an overcoating film made of an insulation material on the entire surface of the substrate after completion of the process of applying second annealing process.

13. The method of manufacturing a thin film diode according to claim 8, wherein the first annealing process is carried out at a temperature of 400 to 500° C.

14. The method of manufacturing a thin film diode according to claim 8, wherein the first annealing process is carried out at a temperature of 400 to 500° C. for 120 minutes or longer.

* * * * *